United States Patent
Sadaka

(10) Patent No.: US 10,553,562 B2
(45) Date of Patent: Feb. 4, 2020

(54) METHODS OF FORMING BONDED SEMICONDUCTOR STRUCTURES, AND SEMICONDUCTOR STRUCTURES FORMED BY SUCH METHODS

(71) Applicant: Sony Semiconductor Solutions Corporation, Kanagawa (JP)

(72) Inventor: Mariam Sadaka, Austin, TX (US)

(73) Assignee: Sony Semiconductor Solutions Corporation, Kanagawa (JP)

(*) Notice: Subject to any disclaimer, the term of this patent is extended or adjusted under 35 U.S.C. 154(b) by 0 days.

(21) Appl. No.: 15/695,291

(22) Filed: Sep. 5, 2017

(65) Prior Publication Data

US 2018/0012869 A1 Jan. 11, 2018

Related U.S. Application Data

(63) Continuation of application No. 13/077,292, filed on Mar. 31, 2011, now abandoned.

(51) Int. Cl.
*H01L 25/065* (2006.01)
*H01L 21/768* (2006.01)
(Continued)

(52) U.S. Cl.
CPC .... *H01L 25/0657* (2013.01); *H01L 21/76898* (2013.01); *H01L 23/3677* (2013.01); *H01L 23/481* (2013.01); *H01L 24/80* (2013.01); *H01L 24/92* (2013.01); *H01L 25/50* (2013.01); *H01L 24/03* (2013.01); *H01L 24/05* (2013.01); *H01L 2221/6834* (2013.01);
(Continued)

(58) Field of Classification Search
None
See application file for complete search history.

(56) References Cited

U.S. PATENT DOCUMENTS

| 5,432,677 A * | 7/1995 | Mowatt | H01L 23/5383 |
| | | | 174/252 |
| 5,998,808 A * | 12/1999 | Matsushita | H01L 21/8221 |
| | | | 257/232 |

(Continued)

*Primary Examiner* — David E Graybill
(74) *Attorney, Agent, or Firm* — Sheridan Ross, P.C.

(57) ABSTRACT

Methods of forming bonded semiconductor structures include providing a first semiconductor structure including a device structure, bonding a second semiconductor structure to the first semiconductor structure below about 400° C., forming a through wafer interconnect through the second semiconductor structure and into the first semiconductor structure, and bonding a third semiconductor structure to the second semiconductor structure on a side thereof opposite the first semiconductor structure. In additional embodiments, a first semiconductor structure is provided. Ions are implanted into a second semiconductor structure. The second semiconductor structure is bonded to the first semiconductor structure. The second semiconductor structure is fractured along an ion implant plane, a through wafer interconnect is formed at least partially through the first and second semiconductor structures, and a third semiconductor structure is bonded to the second semiconductor structure on a side thereof opposite the first semiconductor structure. Bonded semiconductor structures are formed using such methods.

20 Claims, 18 Drawing Sheets

(51) Int. Cl.
*H01L 23/00* (2006.01)
*H01L 23/367* (2006.01)
*H01L 23/48* (2006.01)
*H01L 25/00* (2006.01)

(52) U.S. Cl.
CPC ............ *H01L 2221/68327* (2013.01); *H01L 2221/68372* (2013.01); *H01L 2224/03002* (2013.01); *H01L 2224/033* (2013.01); *H01L 2224/0401* (2013.01); *H01L 2224/05552* (2013.01); *H01L 2224/05571* (2013.01); *H01L 2224/08145* (2013.01); *H01L 2224/0903* (2013.01); *H01L 2224/09051* (2013.01); *H01L 2224/09519* (2013.01); *H01L 2224/131* (2013.01); *H01L 2224/16225* (2013.01); *H01L 2224/16227* (2013.01); *H01L 2224/80203* (2013.01); *H01L 2224/80357* (2013.01); *H01L 2224/80895* (2013.01); *H01L 2224/80896* (2013.01); *H01L 2224/81191* (2013.01); *H01L 2224/81193* (2013.01); *H01L 2224/81815* (2013.01); *H01L 2224/9202* (2013.01); *H01L 2224/94* (2013.01); *H01L 2225/06513* (2013.01); *H01L 2225/06527* (2013.01); *H01L 2225/06541* (2013.01); *H01L 2225/06589* (2013.01); *H01L 2924/00012* (2013.01); *H01L 2924/01029* (2013.01)

(56) References Cited

U.S. PATENT DOCUMENTS

| | | | | |
|---|---|---|---|---|
| 6,184,577 B1* | 2/2001 | Takemura | H01L 21/563 | 257/701 |
| 6,303,468 B1* | 10/2001 | Aspar | H01L 21/76251 | 148/DIG. 12 |
| 6,335,258 B1* | 1/2002 | Aspar | H01L 21/304 | 257/E21.237 |
| 6,600,173 B2* | 7/2003 | Tiwari | H01L 21/76254 | 257/347 |
| 6,642,081 B1* | 11/2003 | Patti | H01L 21/76898 | 257/E21.597 |
| 6,756,286 B1* | 6/2004 | Moriceau | H01L 21/26506 | 257/E21.335 |
| 6,791,178 B2* | 9/2004 | Yamaguchi | H01L 21/486 | 257/699 |
| 6,809,044 B1* | 10/2004 | Aspar | H01L 21/2007 | 257/E21.122 |
| 6,943,067 B2* | 9/2005 | Greenlaw | H01L 21/743 | 257/E21.538 |
| 6,946,365 B2* | 9/2005 | Aspar | H01L 21/76254 | 257/E21.568 |
| 6,952,049 B1* | 10/2005 | Ogawa | H01G 4/232 | 257/678 |
| 7,050,304 B2* | 5/2006 | Hsu | H01L 23/367 | 165/185 |
| RE39,484 E* | 2/2007 | Bruel | B28D 1/005 | 148/33.3 |
| 7,242,092 B2* | 7/2007 | Hsu | H01L 23/36 | 257/678 |
| 7,786,571 B2* | 8/2010 | Chou | H01L 23/3677 | 257/706 |
| 7,843,068 B2* | 11/2010 | Murayama | H01L 23/481 | 257/700 |
| 7,911,044 B2* | 3/2011 | Yang | H01L 23/467 | 257/685 |
| 7,956,448 B2* | 6/2011 | Yu | H01L 21/76898 | 257/684 |
| 8,288,250 B2* | 10/2012 | Clavelier | H01L 21/7813 | 438/107 |
| 8,481,406 B2* | 7/2013 | Sadaka | H01L 21/2007 | 257/E21.211 |
| 8,866,305 B2* | 10/2014 | Sadaka | H01L 21/2007 | 257/774 |
| 9,396,998 B2* | 7/2016 | Kurita | H01L 25/18 | |
| 2002/0001937 A1* | 1/2002 | Kikuchi | H01L 21/4857 | 438/618 |
| 2002/0003232 A1* | 1/2002 | Ahn | G02B 6/4201 | 257/81 |
| 2002/0102816 A1* | 8/2002 | Gonzalez | H01L 21/76254 | 438/455 |
| 2002/0119640 A1* | 8/2002 | Gonzalez | H01L 21/28512 | 438/455 |
| 2003/0129829 A1* | 7/2003 | Greenlaw | H01L 21/743 | 438/637 |
| 2003/0157748 A1* | 8/2003 | Kim | H01L 21/76804 | 438/107 |
| 2003/0193076 A1* | 10/2003 | Patti | H01L 21/76898 | 257/620 |
| 2004/0219765 A1* | 11/2004 | Reif | H01L 21/6835 | 438/458 |
| 2005/0110159 A1* | 5/2005 | Oh | H01L 21/76251 | 257/777 |
| 2005/0258548 A1* | 11/2005 | Ogawa | H01G 4/232 | 257/778 |
| 2006/0105496 A1* | 5/2006 | Chen | H01L 21/76898 | 438/106 |
| 2006/0197181 A1* | 9/2006 | Noguchi | H01L 23/3677 | 257/530 |
| 2007/0096292 A1* | 5/2007 | Machida | H01L 21/4857 | 257/700 |
| 2007/0224776 A1* | 9/2007 | Chiou | H01L 21/76898 | 438/455 |
| 2007/0284747 A1* | 12/2007 | Yao | H01L 21/768 | 257/758 |
| 2008/0079157 A1* | 4/2008 | Kurita | H01L 21/4857 | 257/753 |
| 2008/0157341 A1* | 7/2008 | Yang | H01L 23/467 | 257/700 |
| 2008/0315230 A1* | 12/2008 | Murayama | B81C 1/00301 | 257/98 |
| 2010/0006331 A1* | 1/2010 | Hsu | H01L 23/13 | 174/260 |
| 2010/0075461 A1* | 3/2010 | Clavelier | H01L 21/7813 | 438/109 |
| 2010/0213578 A1* | 8/2010 | Sandhu | H01L 21/76254 | 257/618 |
| 2010/0225001 A1* | 9/2010 | Hizume | H01L 21/565 | 257/773 |
| 2010/0252937 A1* | 10/2010 | Uchiyama | H01L 21/486 | 257/777 |
| 2010/0295136 A1* | 11/2010 | Or-Bach | H01L 21/76254 | 257/390 |
| 2010/0314737 A1* | 12/2010 | Henderson | H01L 23/481 | 257/686 |
| 2010/0327463 A1* | 12/2010 | Yu | H01L 21/76898 | 257/777 |
| 2011/0248396 A1* | 10/2011 | Liu | H01L 25/0657 | 257/686 |
| 2012/0013012 A1* | 1/2012 | Sadaka | H01L 21/2007 | 257/773 |
| 2012/0220102 A1* | 8/2012 | Or-Bach | H01L 21/76254 | 438/458 |
| 2012/0248621 A1* | 10/2012 | Sadaka | H01L 25/0657 | 257/774 |
| 2015/0262877 A1* | 9/2015 | Kurita | H01L 25/18 | 257/737 |
| 2017/0210617 A1* | 7/2017 | Sadaka | B81C 1/00158 | |

* cited by examiner

METHODS OF FORMING BONDED SEMICONDUCTOR STRUCTURES, AND SEMICONDUCTOR STRUCTURES FORMED BY SUCH METHODS

CROSS REFERENCE TO RELATED APPLICATIONS

This application is a continuation of U.S. patent application Ser. No. 13/077,292, filed Mar. 31, 2011, the disclosure of which is incorporated herein by reference in its entirety.

FIELD

Embodiments of the present invention generally relate to methods for forming bonded semiconductor structures, and to the resulting bonded semiconductor structures formed using such methods.

BACKGROUND

The three-dimensional (3D) integration of two or more semiconductor structures can produce a number of benefits to microelectronic applications. For example, 3D integration of microelectronic components can result in improved electrical performance and power consumption while reducing the area of the device footprint. See, for example, P. Garrou, et al. "The Handbook of 3D Integration," Wiley-VCH (2008).

The 3D integration of semiconductor structures may take place by the attachment of a semiconductor die to one or more additional semiconductor dice (i.e., die-to-die (D2D)), a semiconductor die to one or more semiconductor wafers (i.e., die-to-wafer (D2 W)), as well as a semiconductor wafer to one or more additional semiconductor wafers (i.e., wafer-to-wafer (W2 W)), or a combination thereof.

Often, the individual semiconductor structures (e.g., dice or wafers) may be relatively thin and difficult to handle with equipment for processing the semiconductor structures. Thus, so-called "carrier" dice or wafers may be attached to the actual semiconductor structures that include therein the active and passive components of operative semiconductor devices. The carrier dice or wafers do not typically include any active or passive components of a semiconductor device to be formed. Such carrier dice and wafers are referred to herein as "carrier substrates." The carrier substrates increase the overall thickness of the semiconductor structures and facilitate handling of the semiconductor structures (by providing structural support to the relatively thinner semiconductor structures) by processing equipment used to process the active and/or passive components in the semiconductor structures attached thereto that will include the active and passive components of a semiconductor device to be fabricated thereon. Such semiconductor structures that include the active and/or passive components of a semiconductor device to be fabricated thereon, or that will ultimately include the active and/or passive components of a semiconductor device to be fabricated thereon upon completion of the manufacturing process, are referred to herein as "device substrates."

The bonding techniques used in bonding one semiconductor structure to another semiconductor structure may be categorized in different ways, one being whether a layer of intermediate material is provided between the two semiconductor structures to bond them together, and the second being whether the bonding interface allows electrons (i.e., electrical current) to pass through the interface. So called "direct bonding methods" are methods in which a direct solid-to-solid chemical bond is established between two semiconductor structures to bond them together without using an intermediate bonding material between the two semiconductor structures to bond them together. Direct metal-to-metal bonding methods have been developed for bonding metal material at a surface of a first semiconductor structure to metal material at a surface of a second semiconductor structure.

Direct metal-to-metal bonding methods may also be categorized by the temperature range in which each is carried out. For example, some direct metal-to-metal bonding methods are carried out at relatively high temperatures resulting in at least partial melting of the metal material at the bonding interface. Such direct bonding processes may be undesirable for use in bonding processed semiconductor structures that include one or more device structures, as the relatively high temperatures may adversely affect the earlier formed device structures.

"Thermo-compression" bonding methods are direct bonding methods in which pressure is applied between the bonding surfaces at elevated temperatures between two hundred degrees Celsius (200° C.) and about five hundred degrees Celsius (500° C.), and often between about three hundred degrees Celsius (300° C.) and about four hundred degrees Celsius (400° C.).

Additional direct bonding methods have been developed that may be carried out at temperatures of two hundred degrees Celsius (200° C.) or less. Such direct bonding processes carried out at temperatures of two hundred degrees Celsius (200° C.) or less are referred to herein as "ultra-low temperature" direct bonding methods. Ultra-low temperature direct bonding methods may be carried out by careful removal of surface impurities and surface compounds (e.g., native oxides), and by increasing the area of intimate contact between the two surfaces at the atomic scale. The area of intimate contact between the two surfaces is generally accomplished by polishing the bonding surfaces to reduce the surface roughness up to values close to the atomic scale, by applying pressure between the bonding surfaces resulting in plastic deformation, or by both polishing the bonding surfaces and applying pressure to attain such plastic deformation.

Some ultra-low temperature direct bonding methods may be carried out without applying pressure between the bonding surfaces at the bonding interface, although pressure may be applied between the bonding surfaces at the bonding interface in other ultra-low temperature direct bonding methods in order to achieve suitable bond strength at the bonding interface. Ultra-low temperature direct bonding methods in which pressure is applied between the bonding surfaces are often referred to in the art as "surface assisted bonding" or "SAB" methods. Thus, as used herein, the tetras "surface assisted bonding" and "SAB" mean and include any direct bonding process in which a first material is directly bonded to a second material by abutting the first material against the second material and applying pressure between the bonding surfaces at the bonding interface at a temperature of two hundred degrees Celsius (200° C.) or less.

Carrier substrates are typically attached to device substrates using an adhesive. Similar bonding methods may also be used to secure one semiconductor structure that includes active and/or passive components of one or more semiconductor devices therein to another semiconductor structure that also includes active and/or passive components of one or more semiconductor devices therein.

Semiconductor dice may have electrical connections that do not match the connections on other semiconductor structures to which they are to be connected. An interposer (i.e., an additional structure) may be placed between two semiconductor semiconductor structures or between any semiconductor die and a semiconductor package to reroute and align appropriate electrical connections. The interposer may have one or more conductive traces and vias used to make proper contact between the desired semiconductor structures.

BRIEF SUMMARY

Embodiments of the present invention may provide methods and structures for forming semiconductor structures, and more particularly, methods and structures for forming bonded semiconductor structures. This summary is provided to introduce a selection of concepts, in a simplified form, that are further described in the detailed description of embodiments of the invention. This summary is not intended to identify key features or essential features of the claimed subject matter, nor is it intended to be used to limit the scope of the claimed subject matter.

In some embodiments, the present invention includes methods of forming bonded semiconductor structures. In accordance with such methods, a first semiconductor structure is provided that includes at least one device structure. A second semiconductor structure is bonded to the first semiconductor structure at a temperature or temperatures below about 400° C. At least one through wafer interconnect is formed through the second semiconductor structure and into the first semiconductor structure to the at least one device structure. The second semiconductor structure is bonded on a side thereof opposite the first semiconductor structure to a third semiconductor structure.

In additional embodiments of methods of forming bonded semiconductor structures, a first semiconductor structure is provided that includes at least one device structure. Ions are implanted into a second semiconductor structure to form an ion implant plane within the second semiconductor structure. The second semiconductor structure is bonded to the first semiconductor structure, and the second semiconductor structure is fractured along the ion implant plane. A portion of the second semiconductor structure remains bonded to the first semiconductor structure. At least one through wafer interconnect is formed through the portion of the second semiconductor structure remaining bonded to the first semiconductor structure, into the first semiconductor structure, and to the at least one device structure. The second semiconductor structure is bonded on a side thereof opposite the first semiconductor structure to a third semiconductor structure.

In further embodiments, the present invention includes semiconductor structures formed as part of the methods described herein. For example, a bonded semiconductor structure includes a first semiconductor structure comprising at least one device structure, and a second semiconductor structure bonded to the first semiconductor structure. The second semiconductor structure comprises a portion of a fractured relatively thicker semiconductor structure. At least one through wafer interconnect extends through the second semiconductor structure, at least partially through the first semiconductor structure, and to the at least one device structure.

BRIEF DESCRIPTION OF THE DRAWINGS

Embodiments of the present invention may be understood more fully by reference to the following detailed description of embodiments of the present invention and the appended figures in which.

DETAILED DESCRIPTION

Figure 1:
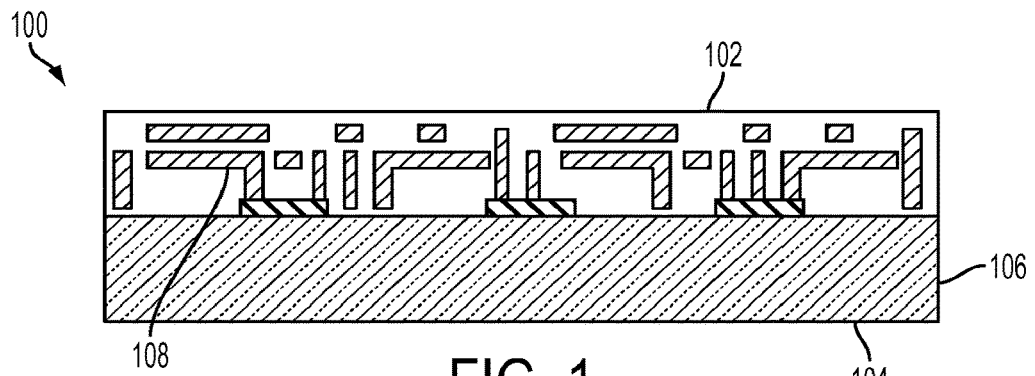
FIGS. 1 through 10 are simplified, schematic cross-sectional views of semiconductor structures and illustrate example embodiments of the invention for forming bonded semiconductor structures and example embodiments of the invention of bonded semiconductor structures.

The illustrations presented herein are not meant to be actual views of any particular material, device, system, or method, but are merely idealized representations that are used to describe embodiments of the invention.

Any headings used herein should not be considered to limit the scope of embodiments of the invention, as defined by the claims below and their legal equivalents. Concepts described in any specific heading are generally applicable in other sections throughout the entire specification.

A number of references are cited herein, the entire disclosures of which are incorporated herein, in their entirety, by this reference for all purposes. Further, none of the cited references, regardless of how characterized herein, is admitted as prior art relative to the invention of the subject matter claimed herein.

As used herein, the term "semiconductor structure" means and includes any structure that is used in the formation of a semiconductor device. Semiconductor structures include, for example, dies and wafers (for example, carrier substrates and device substrates), as well as assemblies or composite structures that include two or more dies and/or wafers three-dimensionally integrated with one another. Semiconductor structures also include fully fabricated semiconductor devices, as well as intermediate structures formed during fabrication of semiconductor devices.

As used herein, the term "processed semiconductor structure" means and includes any semiconductor structure that includes one or more at least partially formed device structures. Processed semiconductor structures are a subset of semiconductor structures, and all processed semiconductor structures are semiconductor structures.

As used herein, the term "bonded semiconductor structure" means and includes any structure that includes two or more semiconductor structures that are attached together. Bonded semiconductor structures are a subset of semiconductor structures, and all bonded semiconductor structures are semiconductor structures. Furthermore, bonded semiconductor structures that include one or more processed semiconductor structures are also processed semiconductor structures.

As used herein, the term "device structure" means and includes any portion of a processed semiconductor structure that is, includes, or defines at least a portion of an active or passive component of a semiconductor device to be formed on or in the semiconductor structure. For example, device structures include active and passive components of integrated circuits such as, for example, transistors, transducers, capacitors, resistors, conductive lines, conductive vias, and conductive contact pads.

As used herein, the term "through wafer interconnect" or "TWI" means and includes any conductive via extending through at least a portion of a first semiconductor structure that is used to provide a structural and/or an electrical interconnection between the first semiconductor structure and a second semiconductor structure across an interface between the first semiconductor structure and the second semiconductor structure. Through wafer interconnects are also referred to in the art by other terms such as "through silicon/substrate vias" or "TSVs," and "through wafer vias" or "TWVs." TWIs typically extend through a semiconductor structure in a direction generally perpendicular to the generally flat, major surfaces of the semiconductor structure (in a direction parallel to the Z axis).

As used herein, the term "active surface," when used in relation to a processed semiconductor structure, means and includes an exposed major surface of the processed semiconductor structure that has been, or will be, processed to form one or more device structures in and/or on the exposed major surface of the processed semiconductor structure.

As used herein, the term "back surface," when used in relation to a processed semiconductor structure, means and includes an exposed major surface of the processed semiconductor structure on an opposing side of the processed semiconductor structure from an active surface of the semiconductor structure.

As used herein, the term "III-V type semiconductor material" means and includes any material predominantly comprised of one or more elements from group IIIA of the periodic table (B, Al, Ga, In, and Ti) and one or more elements from group VA of the periodic table (N, P, As, Sb, and Bi).

As used herein, the term "coefficient of thermal expansion," when used with respect to a material or structure, means the average linear coefficient of thermal expansion of the material or structure at room temperature.

Embodiments of the invention comprise methods and structures for forming semiconductor structures and, more particularly, semiconductor structures that include bonded semiconductor structures and methods of forming such bonded semiconductor structures. Through wafer interconnects may be formed within these semiconductor structures, and may be used in place of separate interposers between structures. Through wafer interconnects may be formed entirely from an active surface, or may be formed in stages, from both the active surface and the back surface.

In some embodiments, through wafer interconnects and/or electrically isolated heat management structures may be used to improve the thermal resistance in bonded semiconductor structures. In some embodiments, through wafer interconnects and/or electrically isolated heat management structures may be used to improve the mismatch in the coefficient of thermal expansion between a semiconductor structure and other structures to which the semiconductor structure may be attached. Embodiments of the methods and the structures of the invention may be utilized for various purposes, such as, for example, for 3D integration processes and to form 3D integrated structures. Multiple semiconductor structures formed by the methods of the embodiments of the invention may be stacked one upon another, connecting the active or back surface of one semiconductor structure with the active or back surface of the other. The remaining surface of each structure may be attached to additional structures.

Example embodiments of the invention are described below with reference to FIGS. 1 through 39.

In one embodiment, the present invention includes providing a first semiconductor structure 100, as shown in FIG. 1, having an active surface 102 and a back surface 104. The active surface 102 may be on a first side of the first semiconductor structure 100, with the back surface 104 on a second, opposite side. The first semiconductor structure 100 may include at least one device structure 108 formed in and/or over a substrate 106. The substrate 106 may comprise, for example, one or more semiconductor materials such as silicon (Si), germanium (Ge), a III-V semiconductor material, etc. Furthermore, the substrate 106 may comprise a single crystal of semiconductor material, and may comprise one or more epitaxial layers of semiconductor material. In additional embodiments, the substrate 106 may comprise one or more dielectric materials such as an oxide (for example, silicon dioxide ($SiO_2$) or aluminum oxide ($Al_2O_3$)), a nitride (for example, silicon nitride ($Si_3N_4$), boron nitride (BN)), etc.

Figure 5:
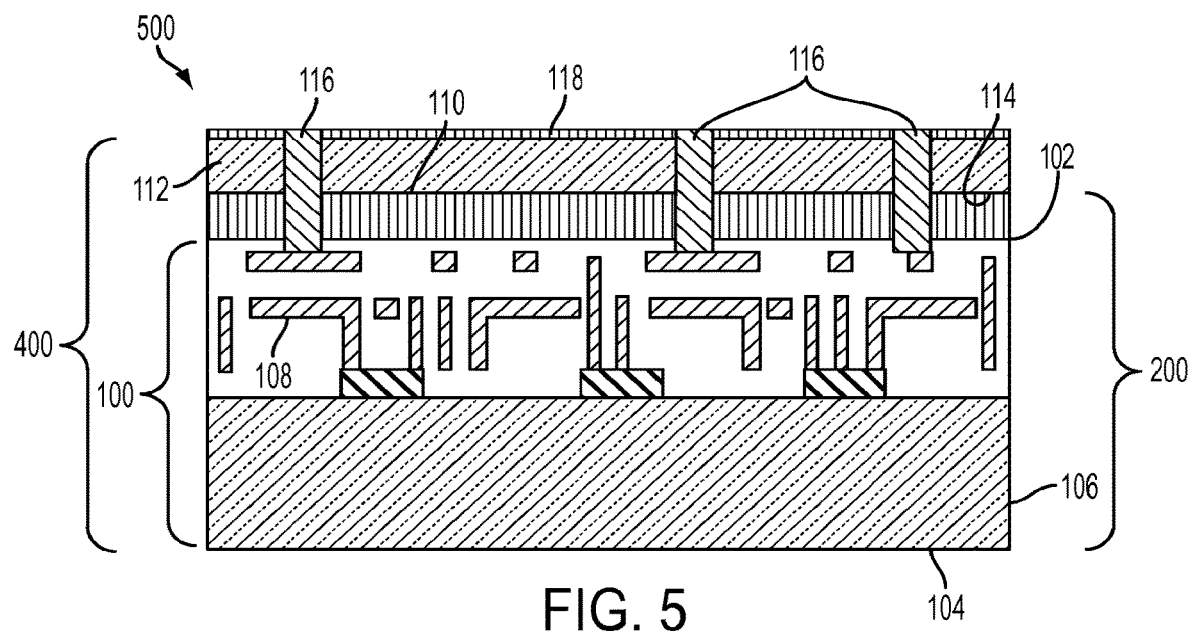

Referring briefly to FIG. 5, a second semiconductor structure 112 may be provided over (e.g., on) the active surface 102 of the first semiconductor structure 100 to form a bonded semiconductor structure 500. The second semiconductor structure 112 may comprise a relatively thin layer of material, such as any of those materials mentioned above in relation to the substrate 106. By way of example and not limitation, the second semiconductor structure 112 may have an average thickness of about 1 micron or less, about 0.5 microns or less, or even about 0.07 microns or less.

Figure 3:
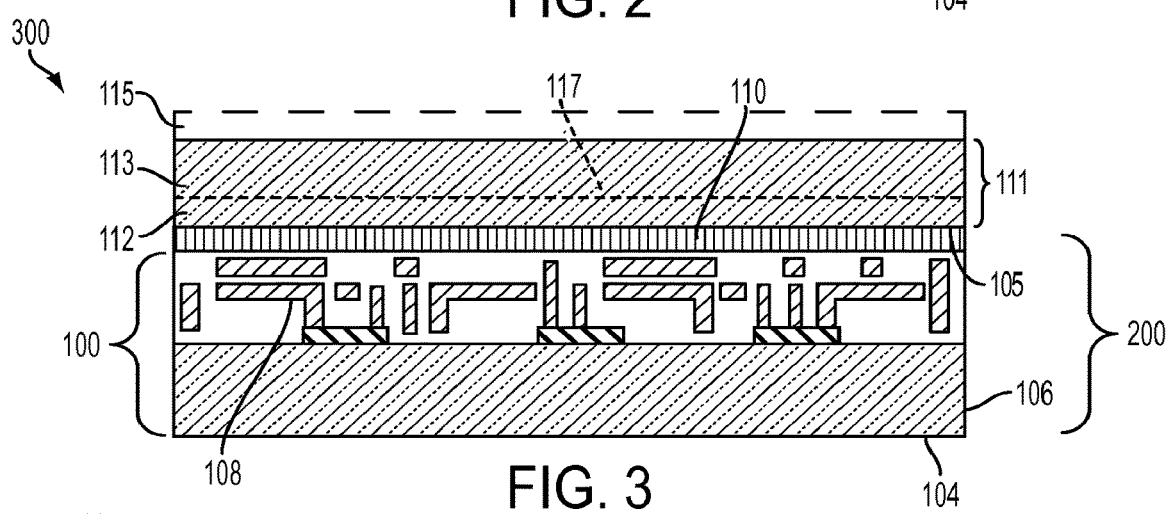

As a non-limiting example, the second semiconductor structure 112 may be provided over the active surface 102 of the first semiconductor structure 100 using what is referred to in the art as the SMART-CUT™ process. For example, as shown in FIG. 3, a semiconductor structure 300 may be formed that includes a bonding layer 110. The bonding layer 110 may comprise one or more layers of bonding materials, such as, for example, silicon oxide, silicon nitride and mixtures thereof. The bonding layer 110 may be formed over the active surface 102 of the first semiconductor structure 100 to form a planarized active surface, thereby improving bonding to subsequent semiconductor structures.

The bonding layer 110 may be disposed between the active surface 102 of the first semiconductor structure 100 and another layer of semiconductor material 111, and may be used to bond the first semiconductor structure 100 to the layer of semiconductor material 111. The first semiconductor structure 100 may be bonded to the layer of semiconductor material 111 using the bonding layer 110 at a temperature of about 400° C. or less, or even at about 350° C. or less, to avoid causing thermal damage to device structures 108 in the first semiconductor structure 100.

In some embodiments of the invention, the layer of semiconductor material 111 may comprise a bulk semiconductor substrate, such as, for example, silicon, germanium, or a III-V compound semiconductor. In some embodiments, the layer of semiconductor material 111 may comprise one or more epitaxial layers disposed upon one another, forming a semiconductor layer structure. In some embodiments of the invention, the layer of semiconductor material 111 maybe attached to an optional sacrificial substrate 115, as shown in phantom in FIG. 3. The optional sacrificial substrate 115 may be attached to the layer of semiconductor material 111 on a side thereof opposite the first semiconductor structure 100.

A portion 113 of the layer of semiconductor material 111 (together with the optional sacrificial substrate 115) may be removed from the layer of semiconductor material 111, leaving a second semiconductor structure 112 behind. Put another way, the semiconductor structure 200 (of FIG. 2) and second semiconductor structure 112 may be removed from the portion 113 of the layer of semiconductor material 111, (together with the optional sacrificial substrate 115 if utilized), to form an intermediate structure 400, shown in FIG. 4.

By way of example and not limitation, the SMART-CUT™ process may be used to separate the portion 113 of the layer of semiconductor material 111 (and the sacrificial substrate 115 if utilized) from the semiconductor structure 200 and the semiconductor structure 112. Such processes are described in detail in, for example, U.S. Pat. No. RE39,484 to Bruel (issued Feb. 6, 2007), U.S. Pat. No. 6,303,468 to Aspar et al. (issued Oct. 16, 2001), U.S. Pat. No. 6,335,258 to Aspar et al. (issued Jan. 1, 2002), U.S. Pat. No. 6,756,286 to Moriceau et al. (issued Jun. 29, 2004), U.S. Pat. No. 6,809,044 to Aspar et al. (issued Oct. 26, 2004), and U.S. Pat. No. 6,946,365 to Aspar et al. (Sep. 20, 2005), the disclosures of each of which are incorporated herein in their entirety by this reference.

Briefly, a plurality of ions (e.g., one or more of hydrogen, helium, or inert gas ions) may be implanted into the layer of semiconductor material 111. In some embodiments of the invention, the plurality of ions may be implanted into the layer of semiconductor material 111 prior to bonding the layer of semiconductor material 111 to semiconductor structure 200. For example, ions may be implanted into the layer of semiconductor material 111, prior to bonding, from an ion source (not shown) positioned on a side of the layer of semiconductor material 111 adjacent surface 105, as illustrated in FIG. 3.

Ions may be implanted along a direction substantially perpendicular to the layer of semiconductor material 111. As known in the art, the depth at which the ions are implanted into the layer of semiconductor material 111 is at least partially a function of the energy with which the ions are implanted into the layer of semiconductor material 111. Generally, ions implanted with less energy will be implanted at relatively shallower depths, while ions implanted with higher energy will be implanted at relatively deeper depths.

Ions may be implanted into the layer of semiconductor material 111 with a predetermined energy selected to implant the ions at a desired depth within the layer of semiconductor material 111. The ions may be implanted into the layer of semiconductor material 111 before or after bonding the layer of semiconductor material 111 to the first semiconductor structure 100. As one particular non-limiting example, the ion implant plane 117 may be disposed within the layer of semiconductor material 111 at a depth from surface 105, such that the average thickness of the second semiconductor structure 112 is in a range extending from about one thousand nanometers (1000 nm) to about one hundred nanometers (100 nm). As known in the art, inevitably at least some ions may be implanted at depths other than the desired implantation depth, and a graph of the concentration of the ions as a function of depth into the layer of semiconductor material 111 from the exposed surface 105 of the layer of semiconductor material 111 (e.g., prior to bonding) may exhibit a generally bell-shaped (symmetric or asymmetric) curve having a maximum at the desired implantation depth.

Upon ion implantation into the layer of semiconductor material 111, the ions may define an ion implant plane 117 (illustrated as a dashed line in FIG. 3) within the layer of semiconductor material 111. The ion implant plane 117 may comprise a layer or region within the layer of semiconductor material 111 that is aligned with (e.g., centered about) the plane of maximum ion concentration within the semiconductor structure 300. The ion implant plane 117 may define a zone of weakness within the semiconductor structure 300 along which the semiconductor structure 300 may be cleaved or fractured in a subsequent process. For example, the semiconductor structure 300 may be heated to cause the semiconductor structure 300 to cleave or fracture along the ion implant plane 117. During this cleaving process, however, the temperature of the semiconductor structure 300 may be maintained at about 400° C. or less, or even at about 350° C. or less to avoid damaging any device structures 108 in the first semiconductor structure 100. Optionally, mechanically forces may be applied to the semiconductor structure 300 to cause or assist in the cleaving of the semiconductor structure 300 along the ion implant plane 117.

Figure 2:
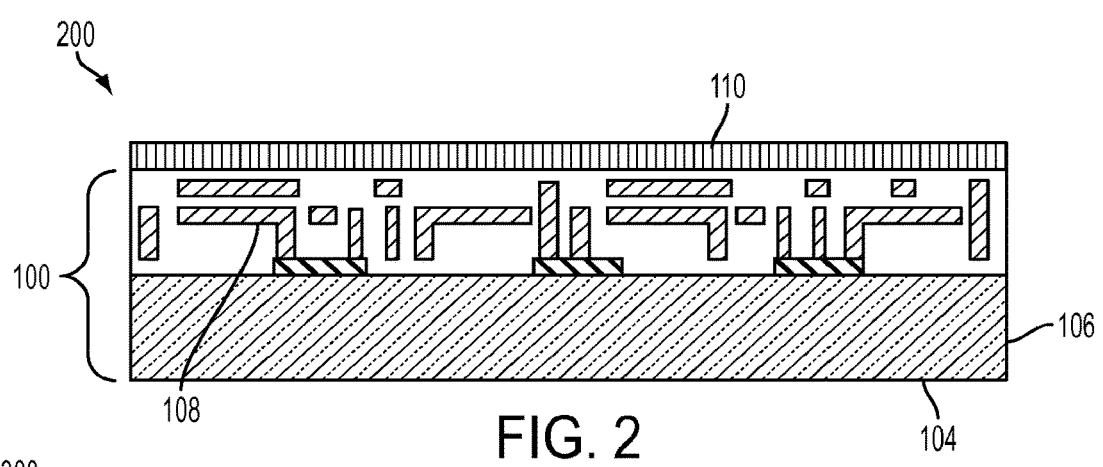
Figure 4:
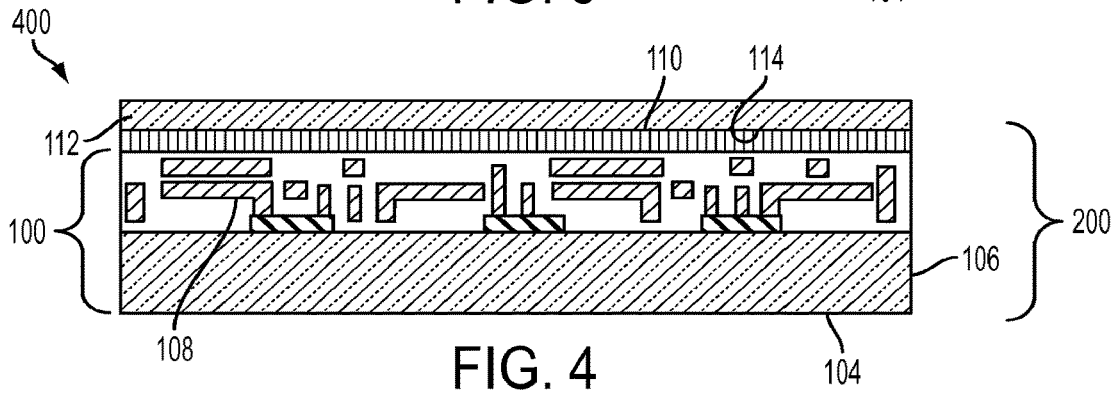

In additional embodiments, the second semiconductor structure 112 may be provided over the active surface 102 of the first semiconductor structure 100 by bonding a relatively thick layer of material (e.g., a layer having an average thickness of greater than about 100 microns) to the first semiconductor structure 100, and subsequently thinning the relatively thick layer of material from the side thereof opposite the first semiconductor structure 100. For example, as shown in FIG. 2, the bonding layer 110, comprising one or more bonding materials, such as an oxide layer, may be provided over (e.g., on) the active surface 102 of the first semiconductor structure 100. As shown in FIG. 4, a bonding surface 114 of a second semiconductor structure 112 may be bonded to the bonding layer 110 on the active surface 102. In additional embodiments, the bonding layer 110 may be provided on the bonding surface 114 of the second semiconductor structure 112, or on both the active surface 102 of the first semiconductor structure 100 and the bonding surface 114 of the second semiconductor structure 112.

The second semiconductor structure 112 may be thinned by removing material from an exposed major surface of the second semiconductor structure 112, For example, the second semiconductor structure 112 may be thinned using a chemical process (e.g., a wet or dry chemical etching process), a mechanical process (e.g., a grinding or lapping process), or by a chemical-mechanical polishing (CMP) process. Such processes may be carried out at a temperature or temperatures of about 400° C. or less, or even about 350° C. or less, to avoid damaging any device structures 108 in the first semiconductor structure 100.

In yet further embodiments, the second semiconductor structure 112 may be formed in situ over (e.g., on) the active surface 102 of the first semiconductor structure 100. For example, the second semiconductor 112 may be formed by depositing material of the second semiconductor structure 112, such as one or more of silicon, polysilicon, or amorphous silicon, on the active surface 102 of the first semiconductor structure 100 to a desirable thickness. By way of example and not limitation, the second semiconductor structure 112 may have an average thickness of about 1 micron or less, about 0.5 microns or less, or even about 0.3 microns or less. In such embodiments, the deposition process may be performed at a temperature or temperatures of about 400° C. or less, or even about 350° C. or less, to avoid damaging any device structures 108 in the first semiconductor structure 100. For example, a low temperature deposition process for forming the second semiconductor structure 112 may be performed by utilizing plasma enhanced chemical vapor deposition processes, as known in the art.

As shown in FIG. 5, at least one through wafer interconnect 116 may be formed through the second semiconductor structure 112 to the first semiconductor structure 100, structurally and electrically connecting with an electrically conductive device structure 108. In other words, each through wafer interconnect 116 may extend to one or more device structures 108, such that physical and electrical contact is established between the through wafer interconnect 116 and the one or more device structures 108.

The through wafer interconnect 116 may be formed by etching a hole or via through the second semiconductor structure 112 to the first semiconductor structure 100, and subsequently filling the hole or via with one or more electrically conductive materials, or by any other method known in the art. Optionally, another bonding layer 118, such as an oxide layer, may be provided on the exposed major surface of the second semiconductor structure 112 in a low temperature (e.g., about 400° C. or less, or even about 350° C. or less) process, forming the semiconductor structure 500 of FIG. 5. The bonding layer 118 may be formed over the second semiconductor structure 112 prior to forming the at least one through wafer interconnect 116. Again, each of the processes used to form the through wafer interconnect 116, including formation of the hole or via, and filling of the hole or via with electrically conductive material, may be carried out at a temperature or temperatures of about 400° C. or less, or even about 350° C. or less, to avoid damaging device structures 108.

Figure 6:
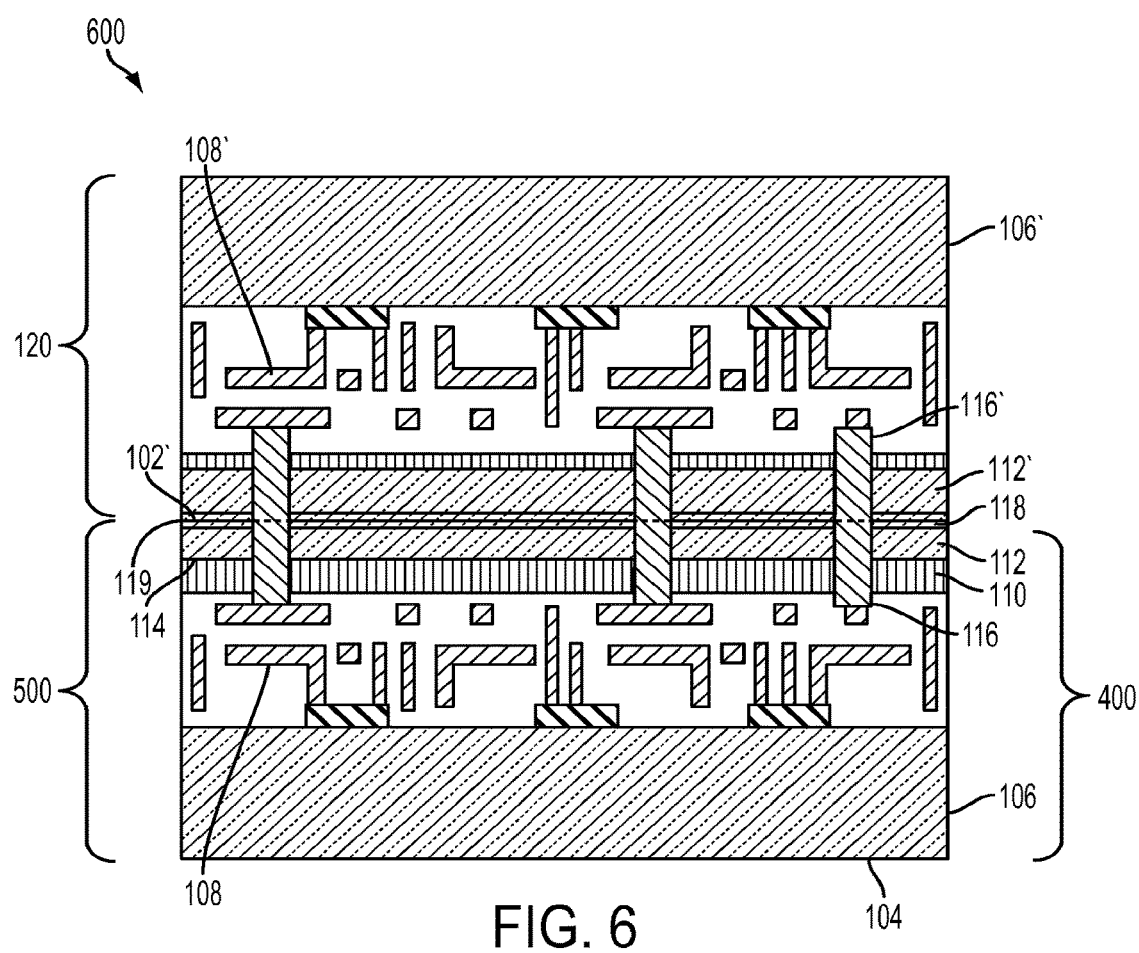

As shown in FIG. 6, a third semiconductor structure 120 may be bonded, through the bonding interface 119, to the active surface 102' of the semiconductor structure 500 to form the bonded semiconductor structure 600. This bonding process may be carried out at a low temperature of about 400° C. or less, or even about 350° C. or less, to avoid damaging device structure 108. In some embodiments, the third semiconductor structure 120 may be at least substantially similar to the semiconductor structure 500 shown in FIG. 5 (and may be formed as described above in relation to the semiconductor structure 500). The third semiconductor structure 120 may be at least substantially similar to the semiconductor structure 500, but may comprise a different arrangement of device structures 108'.

The third semiconductor structure 120 may have an active surface on a first side of the third semiconductor structure 120, and a back surface on a second, opposite side. The third semiconductor structure may comprise a substrate 106' and at least one device structure 108' formed in and/or over the substrate 106'. The second semiconductor structure 112 may function as an interposer between the third semiconductor structure 120 and the first semiconductor structure 100. As shown in FIG. 6, the third semiconductor structure 120 may also include a second semiconductor structure 112' as described above that may also function as an interposer between the third semiconductor structure 120 and the semiconductor structure 500.

The third semiconductor structure 120 may make electrical contact to at least one through wafer interconnect 116 of the semiconductor structure 500. For example, through wafer interconnects 116' of the third semiconductor structure 120 may be bonded to (e.g., structurally and electrically coupled with) the through wafer interconnects 116, through bonding interface 119, to form the semiconductor structure 500.

In some embodiments, the through wafer interconnects 116' may be bonded to the through wafer interconnects 116 by providing conductive bumps or balls of metal material (e.g., a solder alloy) on one or both of the through wafer interconnects 116' and the through wafer interconnects 116, and heating the conductive bumps or balls of metal material to cause the metal material of the conductive bumps or balls to melt and reflow, after which the metal material may be cooled and solidified to form a bond between the through wafer interconnects 116' and the through wafer interconnects 116. In such embodiments, the metal material of the conductive bumps or balls of metal material may have a melting point below about 400° C., or even below about 350° C., to allow the bonding process to be carried out at such relatively low temperatures to avoid damaging device structures 108, 108'.

In additional embodiments, the through wafer interconnects 116' may be directly bonded to the through wafer interconnects 116 in a direct metal-to-metal bonding process without providing any adhesive or other bonding material therebetween. For example, such a direct bonding process may comprise any of a thermo-compressing direct bonding process, an ultra-low temperature direct bonding process, and a surface-assisted direct bonding process, as such processes have been previously defined herein.

In some embodiments, the third semiconductor structure 120 may be bonded to the semiconductor structure 500 using the bonding layer 118, such as an oxide layer, or other bonding materials. Again, such a bonding process may be carried out a temperature or temperatures below about 400° C., or even below about 350° C., to avoid damaging device structures 108, 108'

Figure 7:
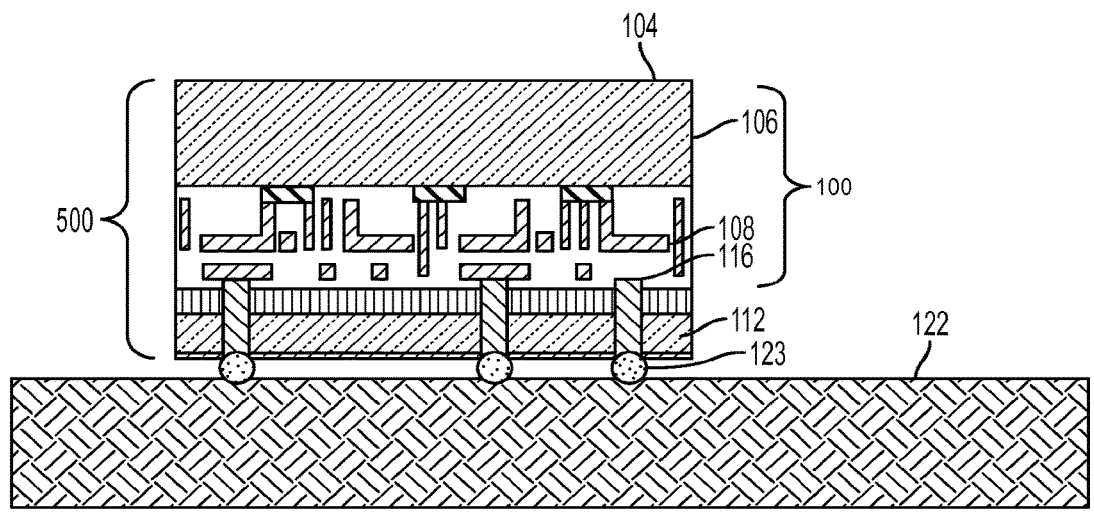

In one embodiment, the semiconductor structure 500 may be placed in electrical contact with another substrate 122, such as a circuit board, as shown in FIG. 7. The semiconductor structure 500 may have conductive bumps 123 connecting the semiconductor structure 500 to the substrate 122. The conductive bumps 123 may be made of gold, copper, silver, or another conductive metal, and may be formed by depositing material onto the through wafer interconnects 116, by depositing material onto the substrate 122 or by any other method known in the art. In such an embodiment, the second semiconductor structure 112 also functions as an interposer between the first semiconductor structure 100 and the substrate 122.

Figure 8:
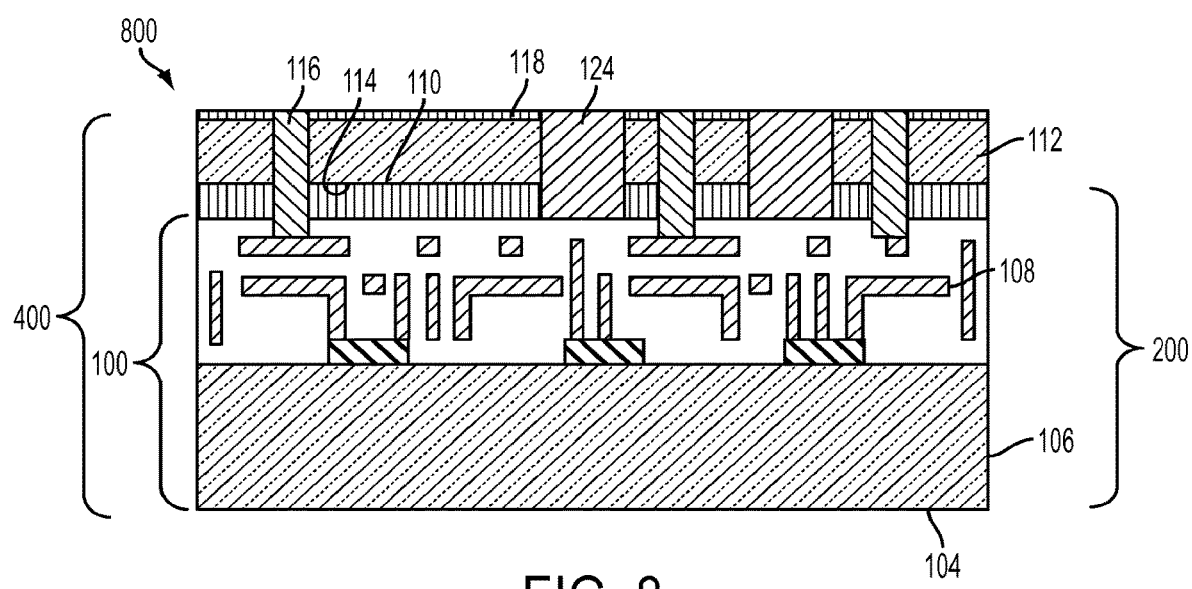

In another embodiment, shown as semiconductor structure 800 in FIG. 8, at least one heat management structure 124 may be formed in the second semiconductor structure 112. The heat management structure 124 may be formed by etching a hole or via in the second semiconductor structure 112, and subsequently filling the hole or via with one or more electrically conductive materials, or by any other method known in the art. The heat management structure 124 may extend to or into the first semiconductor structure 100, as shown in FIG. 8.

Figure 9:
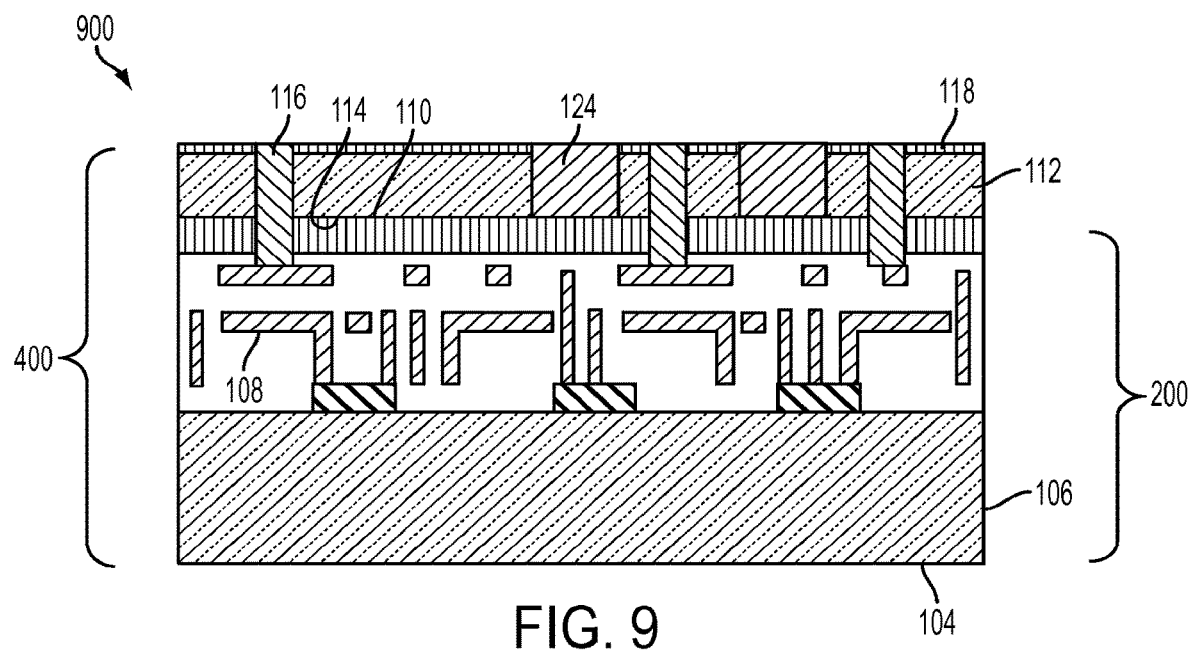

FIG. 9 illustrates an additional embodiment of a semiconductor structure 900 that is similar to the semiconductor structure 800, but in which the heat management structure 124 is disposed entirely within the second semiconductor structure 112. In semiconductor structures 800 and 900, the heat management structure 124 may comprise at least one "dummy" pad or structure, formed of a material that is relatively thermally conductive such as a metal that is electrically isolated from any device structure 108.

Figure 10:
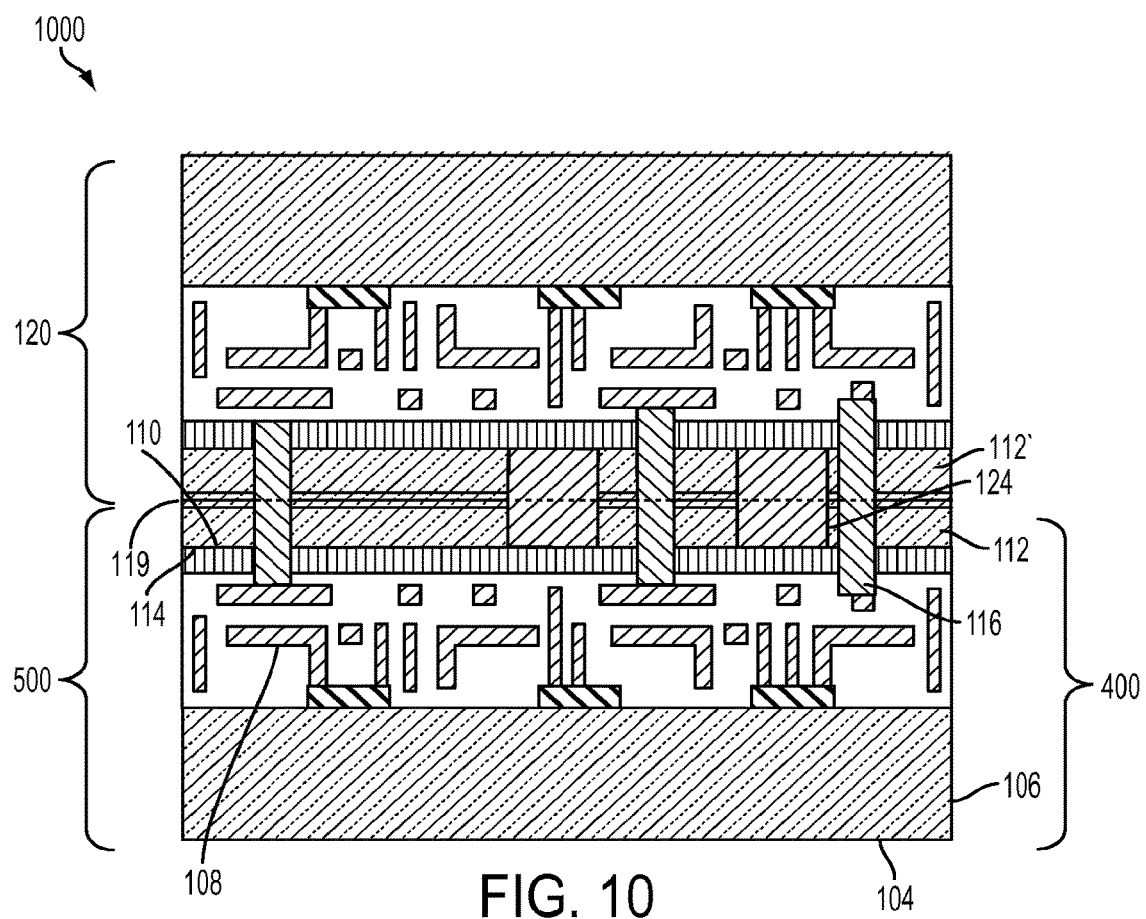

FIG. 10 is used to illustrate a method similar to that previously described, used to attach a third semiconductor structure 120 to the semiconductor structure 800 of FIG. 8 (or the semiconductor structure 900 of FIG. 9) to form a resulting semiconductor structure 1000 shown in FIG. 10. The third semiconductor 120 may itself include a fourth semiconductor structure 112' bonded to the active surface of the third semiconductor structure 120. At least one through wafer interconnect 116 may connect the semiconductor structure 500 to the third semiconductor structure 120 through the second semiconductor structure 112 and the fourth semiconductor structure 112'.

The heat management structure 124 may be used to improve the thermal management of the system by balancing the vertical thermal resistance with lateral heat spreading. By varying the size, number, composition, placement, shape, or depth of the heat management structures 124, the coefficient of thermal expansion exhibited by the interposer, which comprises the second semiconductor structure 112 with the heat management structure 124 therein, may be tailored to a desired value.

For example, the coefficient of thermal expansion of the interposer may be tailored to at least substantially match the coefficient of thermal expansion of the first semiconductor structure 100 to which the interposer is attached, or to at least substantially match the coefficient of thermal expansion of another structure to which the semiconductor structure 800 or 900 may be attached (e.g., the third semiconductor structure 120 of FIG. 10). The heat management structures 124 may be formed of one or more metals such as copper, tungsten, aluminum, or an alloy based on one or more such metals, or any other material that is relatively thermally conductive. The size, number, composition, placement, shape, or depth of the through wafer interconnects 116 may also be varied to cause the interposer to exhibit a desirable coefficient of thermal expansion. In some embodiments, the ratio of the coefficient of thermal expansion of the interposer (the second semiconductor structure 112 with the heat management structures 124 therein) to the coefficient of thermal expansion of the first semiconductor structure 100 may be within a range extending from about 0.67 to about 1.5, within a range extending from about 0.9 to about 1.1, or the ratio may be approximately 1.0. That is, the coefficient of thermal expansion of the interposer may be at least substantially equal to the coefficient of thermal expansion of the first semiconductor structure 100.

In some embodiments of the invention, two sets of through wafer interconnects may be forming from opposite sides of a semiconductor structure. That is, one may be formed through the active surface as described above, and the other may be formed through a back surface. The through wafer interconnects may connect to each other within the semiconductor structure, and may pass electrical signals through the semiconductor structures to further device structures.

Figure 11:
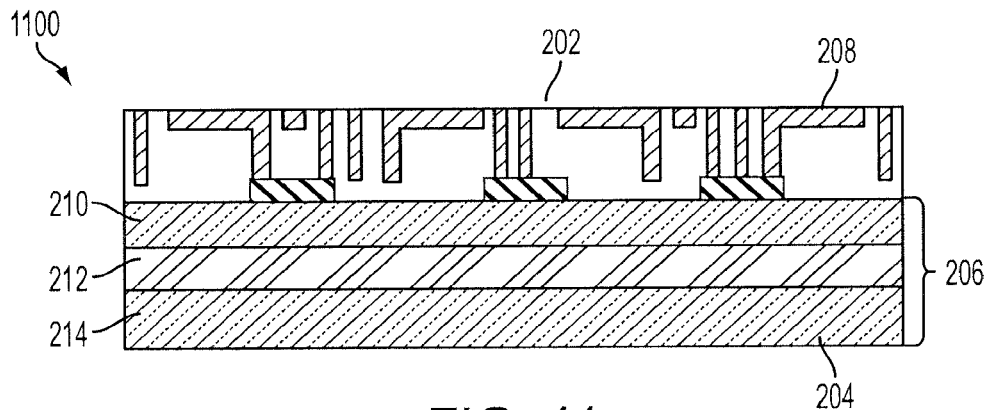
FIGS. 11 through 33 are simplified, schematic cross-sectional views of semiconductor structures and illustrate additional example embodiments of the invention for forming bonded semiconductor structures, including with a carrier substrate, and additional example embodiments of the invention of bonded semiconductor structures.

For example, a semiconductor structure 1100, as shown in FIG. 11, has an active surface 202 on a first side of the semiconductor structure 1100, and a back surface 204 on a second, opposite side of the semiconductor structure 1100. The semiconductor structure 1100 may have at least one device structure 208 formed in and/or over a substrate 206. The substrate 206 may comprise a semiconductor 210 and an insulator 212. The substrate 206 may further comprise one or more additional layers 214, such as an additional layer of semiconductor material. The semiconductor 210 may comprise a layer of one or more semiconductor materials such as silicon (Si), germanium (Ge), a III-V semiconductor material, etc. Furthermore, the substrate 206 may comprise a single crystal of semiconductor material, or an epitaxial layer of semiconductor material. The insulator 212 may comprise one or more layers of dielectric materials such as oxide (for example, silicon dioxide ($SiO_2$) or aluminum oxide ($Al_2O_3$)), a nitride (for example, silicon nitride ($Si_3N_4$) or boron nitride (BN)), etc.

Figure 12:
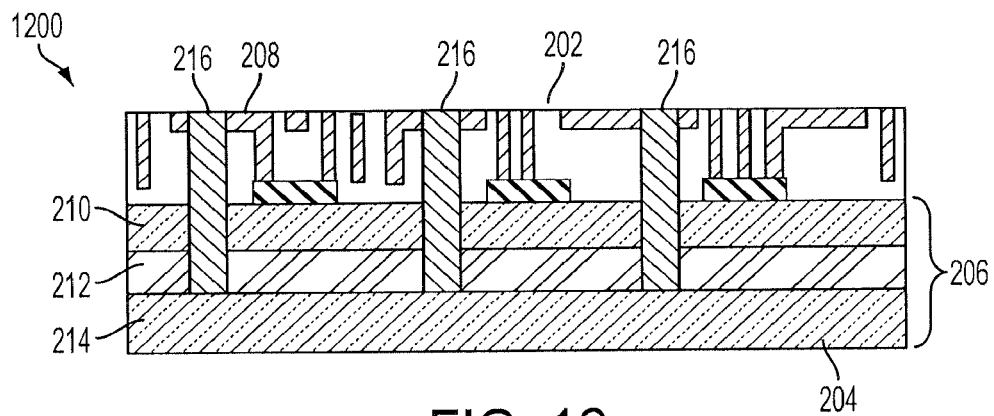

At least one first through wafer interconnect 216 may be formed through the semiconductor structure 1100 to form semiconductor structure 1200, as shown in FIG. 12. The at least one first through wafer interconnect 216 may be formed from the active surface 202, partially through the substrate 206, connecting with at least one device structure 208. In other words, each first through wafer interconnect 216 may extend to one or more device structures 208, such that physical and electrical contact is established between the first through wafer interconnect 216 and the one or more device structures 208. The first through wafer interconnect 216 may be formed by etching a hole or via through the semiconductor structure 1100, and subsequently filling the hole or via with one or more electrically conductive materials, or by any other method known in the art. Such processes may be carried out at a temperature or temperatures of about 400° C. or less, or even below about 350° C. or less, as previously discussed.

Figure 13:
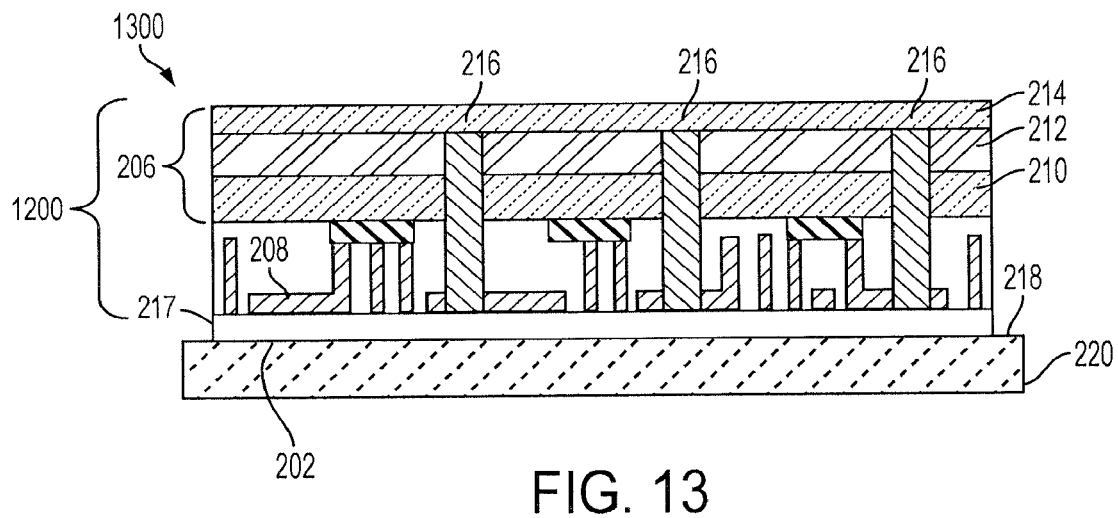

One or more additional layers 217 may optionally be added to the active surface of semiconductor structure 1200, as shown in FIG. 13. The one or more additional layers 217 may comprise additional bonding layers. The additional bonding layers may be utilized to planarize active surface 202 of semiconductor structure 1200 to assist in bonding semiconductor structure 1200 to a carrier substrate 220. Upon addition of additional layers 217, the layer added last comprises the active surface 202. The active surface 202 may be bonded to a bonding surface 218 of the carrier substrate 220 to form the semiconductor structure 1300 of FIG. 13. With the carrier substrate 220 providing structural support, the substrate 206 of the semiconductor structure 1300 may be thinned by removing material therefrom, using, for example, a chemical mechanical polishing (CMP) process or any other method known in the art. Such processes also may be carried out at a temperature or temperatures of about 400° C. or less, or even below about 350° C. or less, as previously discussed.

Figure 14:
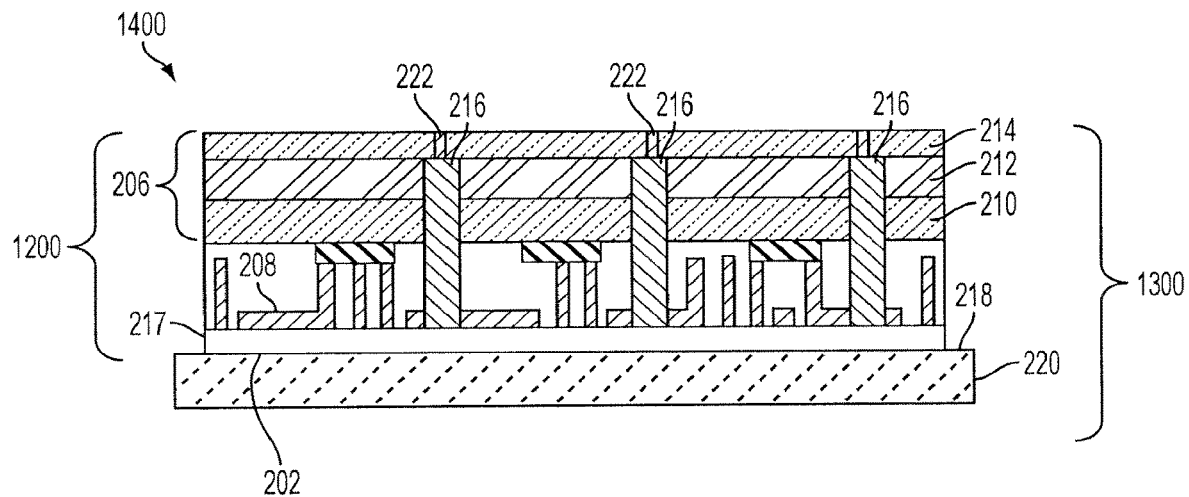
Figure 15:
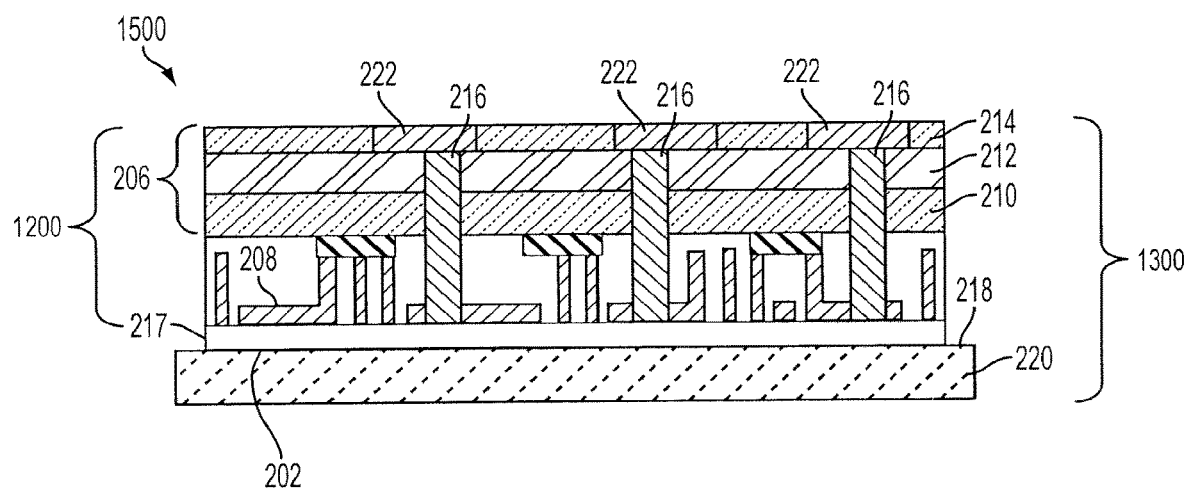

As shown in FIGS. 14 and 15, at least one second through wafer interconnect 222 may be formed through a portion of the thinned substrate 206. The second through wafer interconnect 222 may be located and oriented such that physical and electrical contact is established between the second through wafer interconnect 222 and the first through wafer interconnect 216. Thus, electrical connection is established between the device structure 208 and the second through wafer interconnect 222 through the first through wafer interconnect 216.

The second through wafer interconnect 222 may have a different cross-sectional size and/or shape from the first through wafer interconnect 216. For example, the second through wafer interconnect 222 may be smaller in cross-sectional size than the first through wafer interconnect 216, as illustrated in the semiconductor structure 1400 of FIG. 14. In additional embodiments, the second through wafer interconnect 222 may be larger in cross-sectional size than the first through wafer interconnect 216, as illustrated in the semiconductor structure 1500 of FIG. 15. In yet further embodiments, the second through wafer interconnect 222 may have the same cross-sectional size as the first through wafer interconnect 216. The coefficient of thermal expansion of the semiconductor structures 1400 and 1500 may be tailored to a desired value by varying the size, number, composition, placement, and/or depth of the first through wafer interconnect 216, the second through wafer interconnect 222, or both the first through wafer interconnect 216 and the second through wafer interconnect 222.

Forming the second through wafer interconnect 222 separately from the first through wafer interconnect 216 may result in higher yield than forming a through wafer interconnect entirely through the substrate 206 of the semiconductor structure 1100 (of FIG. 11) in one single step. Forming the second through wafer interconnect 222 separately from the first through wafer interconnect may improve yield by decreasing the aspect ratio (AR) of the etch processes and because the second through wafer interconnect 222 may be formed entirely through a single homogeneous material.

The second through wafer interconnect 222 may be formed a temperature or temperatures of about 400° C. or less, or even below about 350° C. or less, using previously described methods.

In some embodiments, a first through wafer interconnect 216 may be formed to different depths within a semiconductor structure. That is, the first through wafer interconnect 216 may be formed through more or fewer layers of material than described above. A second through wafer interconnect 222 may then be formed such that it meets the first through wafer interconnect 216 and makes electrical contact.

Figure 16:
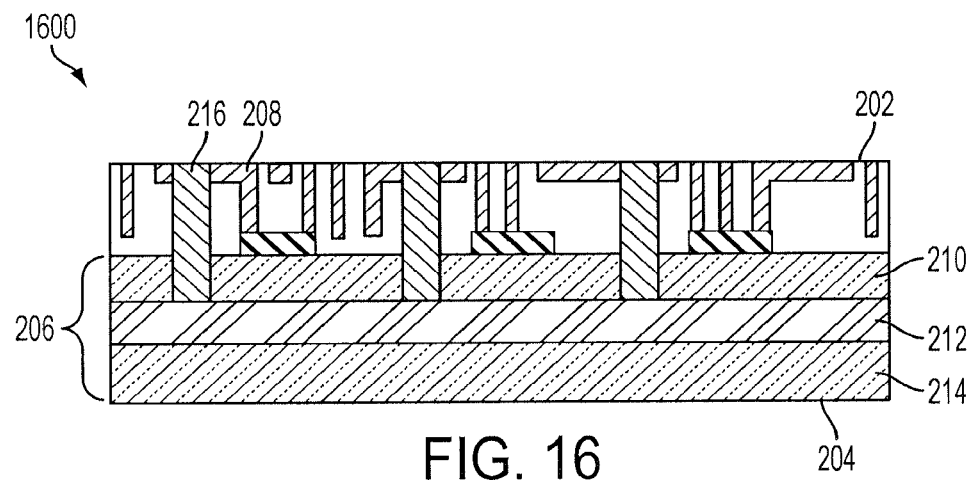

For example, as shown in FIG. 16, semiconductor structure 1600 has an active surface 202 on a first side of the semiconductor structure 1600, and a back surface 204 on a second, opposite side of the semiconductor structure 1600. The semiconductor structure 1600 may have at least one device structure 208 formed in and/or over a substrate 206. The substrate 206 may comprise a semiconductor 210 and an insulator 212. The substrate 206 may further comprise one or more additional layers 214, such as an additional layer of semiconductor material. The semiconductor 210 may comprise a layer of one or more semiconductor materials such as silicon (Si), germanium (Ge), a III-V semiconductor material, etc. Furthermore, the substrate 206 may comprise a single crystal of semiconductor material, or an epitaxial layer of semiconductor material. The insulator 212 may comprise one or more layers of dielectric materials such as oxide (for example, silicon dioxide ($SiO_2$) or aluminum oxide ($Al_2O_3$)), a nitride (for example, silicon nitride ($Si_3N_4$) or boron nitride (BN)), etc.

A first through wafer interconnect 216 may be formed through the semiconductor structure 1600 from the active surface 202, through the semiconductor 210, and at least partially through the insulator 212. The first through wafer interconnect 216 may be formed as described above, and may extend through or to one or more device structures 208.

Figure 17:
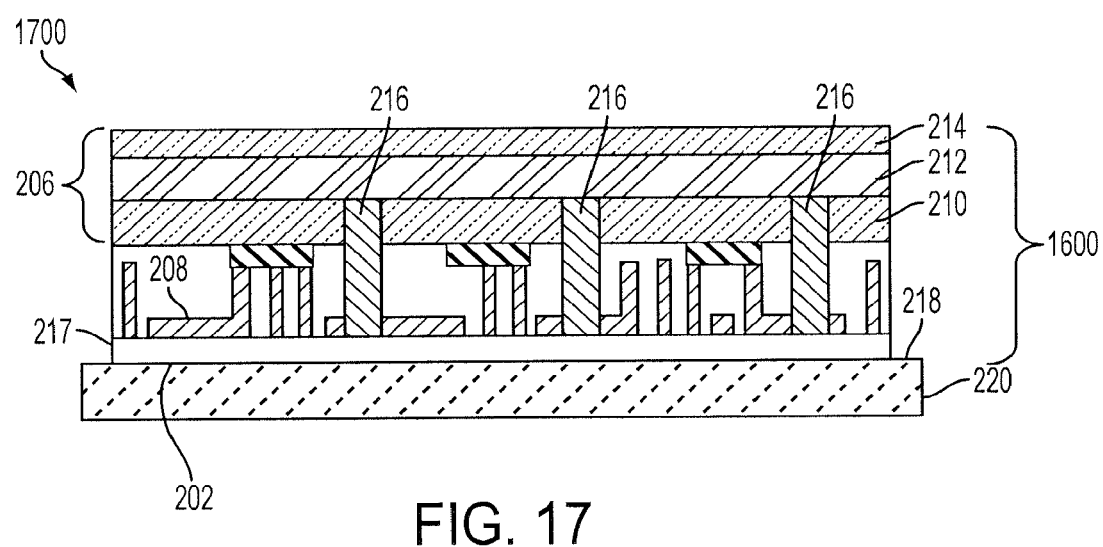

One or more additional layers 217 (e.g., additional bonding layers) may optionally be added to the active surface 202 of the semiconductor structure 1600 to form the semiconductor structure 1700 shown in FIG. 17. Upon addition of additional layers 217, the layer added last comprises the active surface 202. The active surface 202 may be bonded to a bonding surface 218 of a carrier substrate 220 to form the semiconductor structure 1700. With the carrier substrate 220 providing structural support, the substrate 206 of the semiconductor structure 1700 may be thinned by removing material therefrom, using, for example, chemical mechanical polishing or any other method known in the art.

Figure 18:
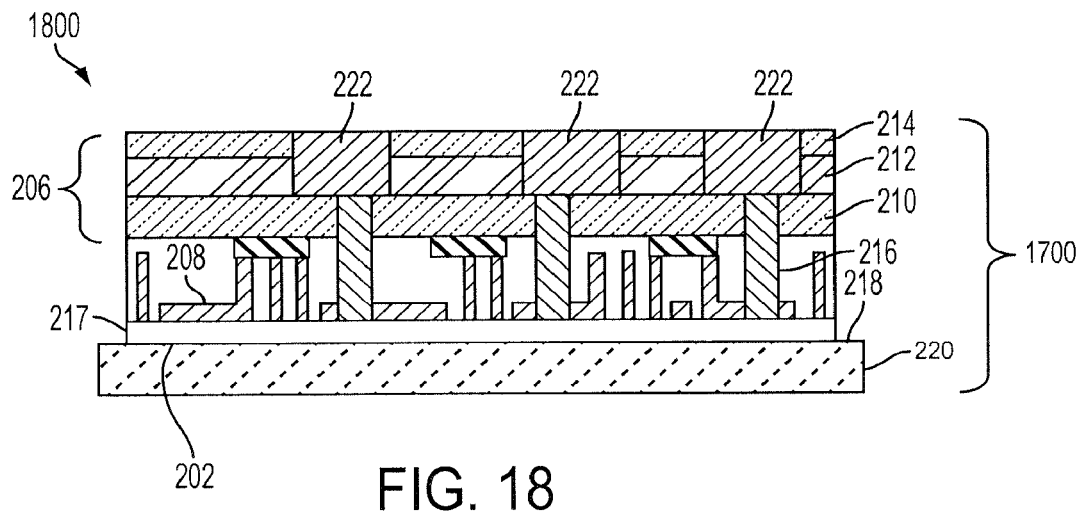
Figure 19:
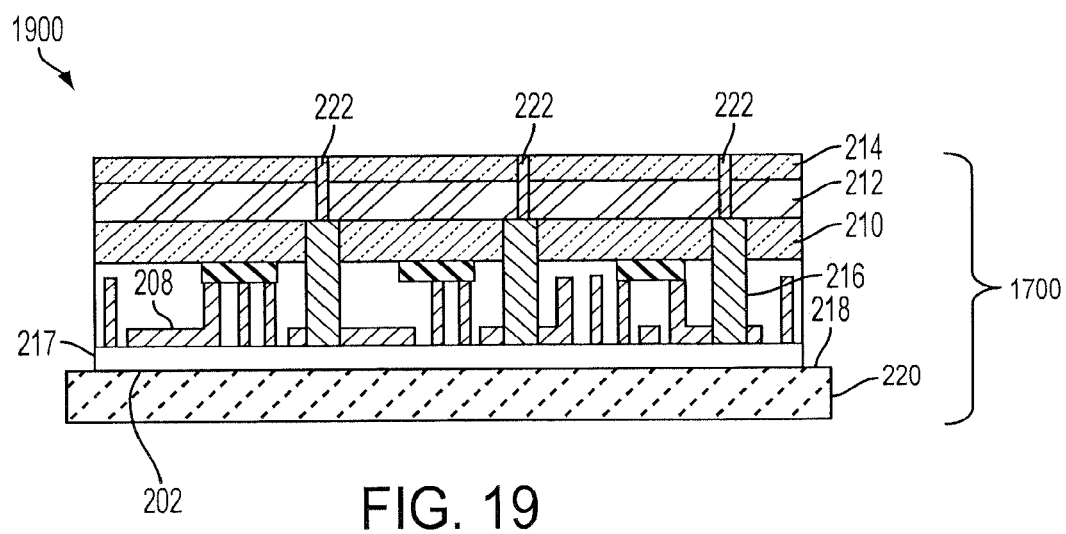

At least one second through wafer interconnect 222 may then be formed through the one or more additional layers 214 and the insulator 212 to form the semiconductor structures 1800 and 1900 in FIGS. 18 and 19. The second through wafer interconnect 222 may have a cross-section that differs in at least one of size and shape from a cross-section of the first through wafer interconnect 216. For example, the cross-section of the second through wafer interconnect 222 may be smaller than the cross-section of the first through wafer interconnect 216, as in semiconductor structure 1800 of FIG. 18, or larger than the cross-section of the first through wafer interconnect 216, as in semiconductor structure 1900 of FIG. 19. In additional embodiments, the second through wafer interconnect 222 may have a cross-sectional shape that is the same size and shape as the cross-section of the first through wafer interconnect 216. The coefficient of thermal expansion of the semiconductor structures 1800 and 1900 may be tailored to a desired value by varying the size, number, composition, placement, shape, or depth of the first through wafer interconnect 216, the second through wafer interconnect 222, or both.

The first through wafer interconnect 216 and the second through wafer interconnect 222 may be formed at a temperature or temperatures of about 400° C. or less, or even about 350° C. or less, to avoid damaging device structures 208 as previously discussed.

Figure 20:
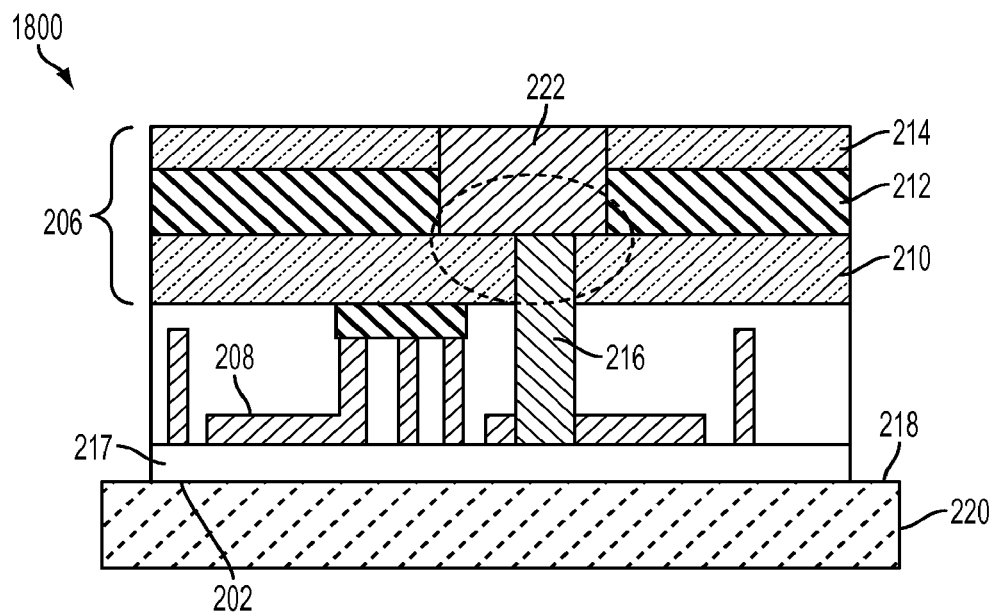
Figure 21:
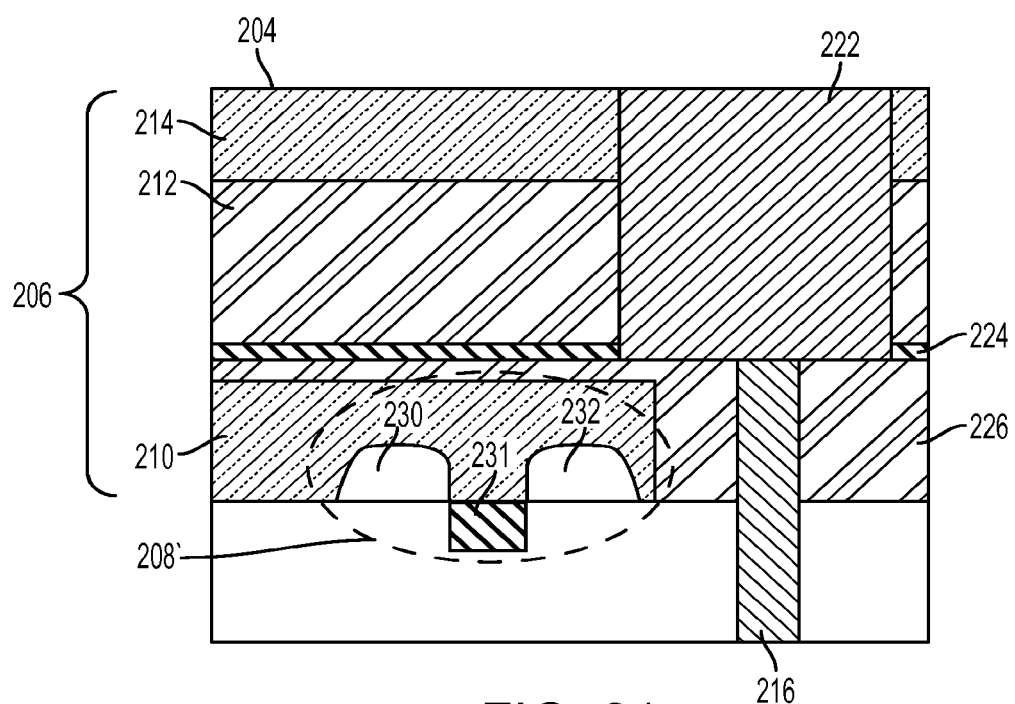
Figure 22:
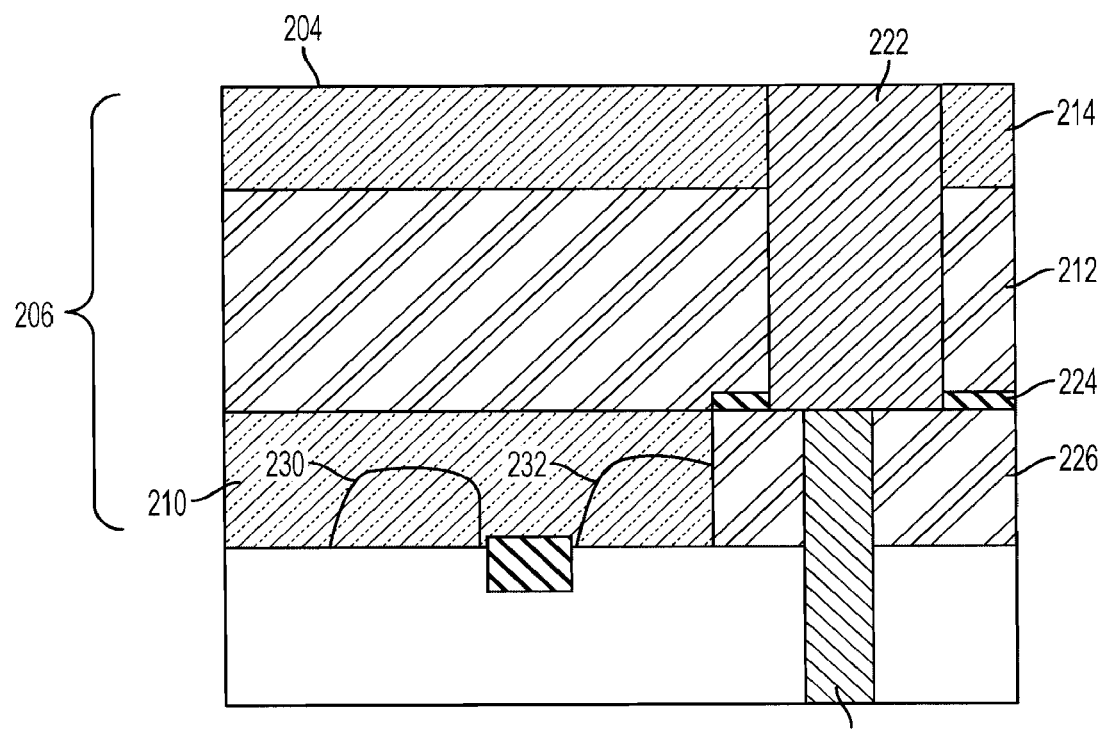

FIG. 20 shows an enlarged view of a portion of the semiconductor structure 1800 of FIG. 18, and FIG. 21 shows an enlarged view of the portion of FIG. 20 within the dashed circle shown therein. As shown in FIG. 21, in some embodiments, an etch stop 224 may be disposed between the semiconductor 210 and the insulator 212 to assist in the formation of the first through wafer interconnect 216 and the second through wafer interconnect 222, as discussed below.

The first through wafer interconnect 216 may be formed in a similar manner as previously described with reference to FIG. 12. However, in embodiments described below, the addition of an etch stop 224 may assist in through wafer interconnect fabrication. For example, a patterned mask layer (not shown) may be applied to the active surface 202 to protect areas not to be etched. The structure exposed through the patterned mask layer then may be subjected to a selective etchant using a wet chemical etching process, a dry reactive ion etching process, or any other etching process known in the art. The structure may be selectively etched to the etch stop 224, forming a hole or via therein. In other words, the etching process will etch through the semiconductor structure 1800 and selective stop on the etch stop 224. The etch stop 224 may comprise a layer of material that will not be etched, or that will be etched at a substantially lower rate than the surrounding materials. By way of example and not limitation, the etch stop 224 may comprise a layer of a nitride material such as silicon nitride ($Si_3N_4$). The etch stop 224 may be between layers of the substrate 206, in which case one or more layers may be etched with the structure. Once a hole or via has been etched in the structure to the etch stop 224, the hole or via may be filled with one or more electrically conductive materials to form the first through wafer interconnect 216.

The second through wafer interconnect 222 may be formed in a similar manner. First, a patterned mask layer (not shown) may be applied to the back surface 204 to protect areas not to be etched. The substrate 206 exposed through the patterned mask layer then may be subjected to a selective etchant using a wet chemical etching process, a dry reactive ion etching process, or any other etching process known in the art. The substrate 206 may be selectively etched to the etch stop 224. The etching process will etch through the semiconductor structure and selective stop on the etch stop 224. To connect the second through wafer interconnect with the first through wafer interconnect, the material of the etch stop 224 exposed within the via or hole may be removed. As previously mentioned, the etch stop 224 may be made of a material substantially impervious to the etchants used to form the holes or vias through the structure and the substrate 206. In other words, the etch rate of a selected etching process may be substantially slower through the etch stop than the etch rate through the structure and the substrate 206. To remove the etch stop 224 and allow electrical connection of the through wafer interconnects 216 and 222, a different etching process or chemistry may be selected. The different etching process may remove the etch stop 224 at a rate substantially higher than the etch rate of the etching process used to form the holes or vias through the structure and the substrate 206. This different etching process may be ineffective at etching the other materials of the structure and the substrate 206.

In FIG. 21, examples of device structures 208 are shown as the transistor 208' comprising source region 230, gate electrode 231 and drain region 232. These features are by example only and not intended to limit the types of device structure 208 in the semiconductor structure 1800. At least one shallow trench isolation structure 226 may be disposed adjacent (e.g., around) the first through wafer interconnect 216. The shallow trench isolation structure 226 may isolate the through wafer interconnects 216 and 222 from the at least one device structures 208, as well as isolating addition device structures (not shown) from the device structures 208'.

In some embodiments, at least a portion of the second through wafer interconnect 222 may extend laterally and overlap a portion of the semiconductor 210, and the second through wafer interconnect 222 may extend laterally beyond a peripheral boundary of the shallow trench isolation structure 226, as shown in FIG. 21.

Figure 23:
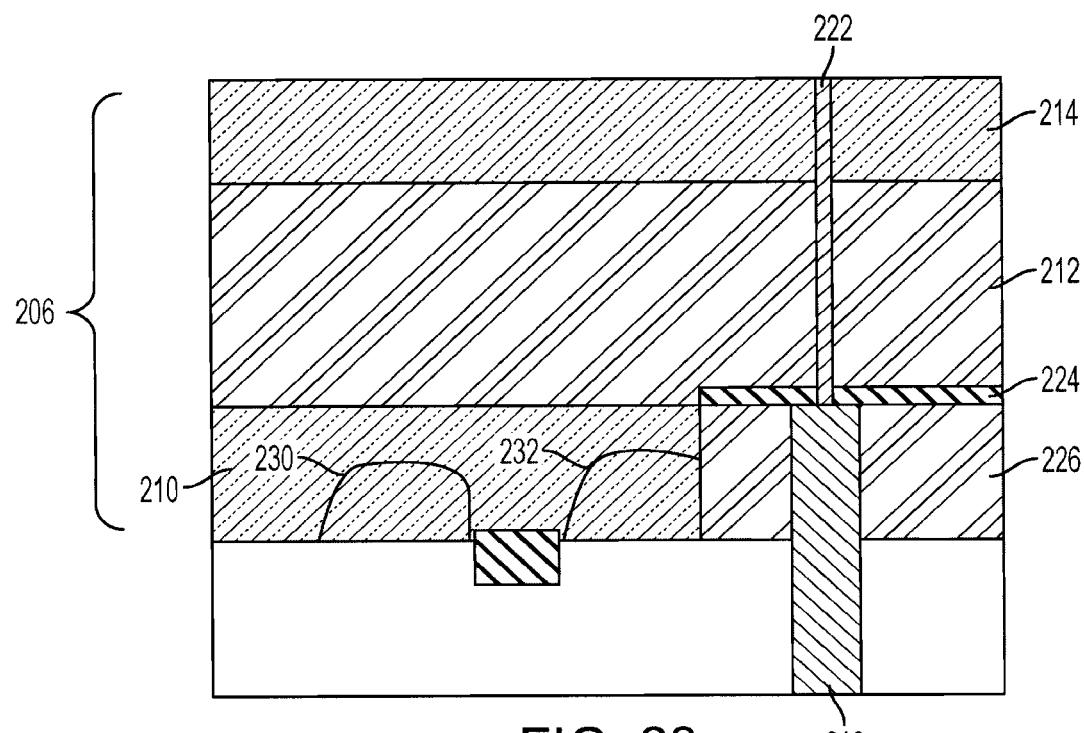
Figure 24:
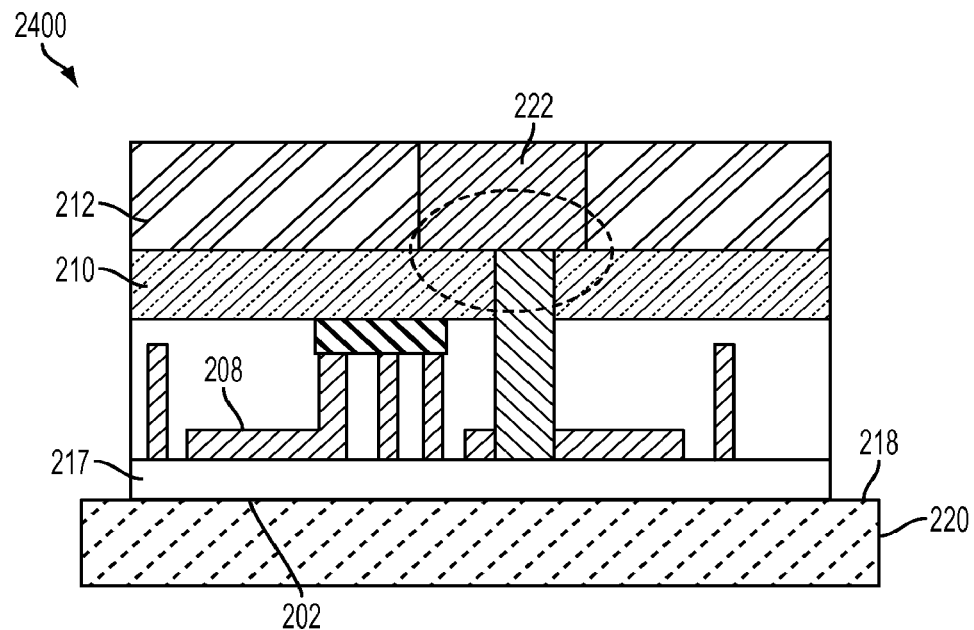

In some embodiments, the shallow trench isolation structure 226 may be wider than a width of the second through wafer interconnect 222. For example, in FIG. 22, the second through wafer interconnect 222 may be narrower in lateral cross-section than the shallow trench isolation structure 226 and therefore may not overlap the semiconductor 210 remaining after formation of the first through wafer interconnect 216 and the shallow trench isolation structure 226. In other embodiments, shown in FIG. 23, the second through wafer interconnect 222 may be narrower in lateral cross-section than the first through wafer interconnect 216. In other words, the cross-sectional area of the second through wafer interconnect 222 may be smaller than the cross-sectional area of the first through wafer interconnect 216. The portion of the etch stop 224 remaining after the formation of the second through wafer interconnect 222 may therefore overlay a portion of the first through wafer interconnect 216, as shown in FIG. 23.

Figure 25:
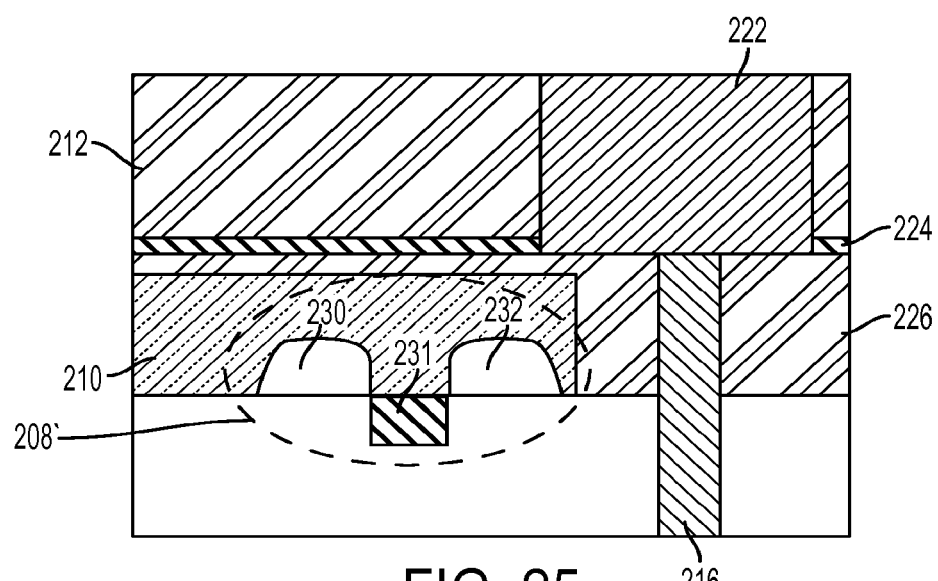
Figure 26:
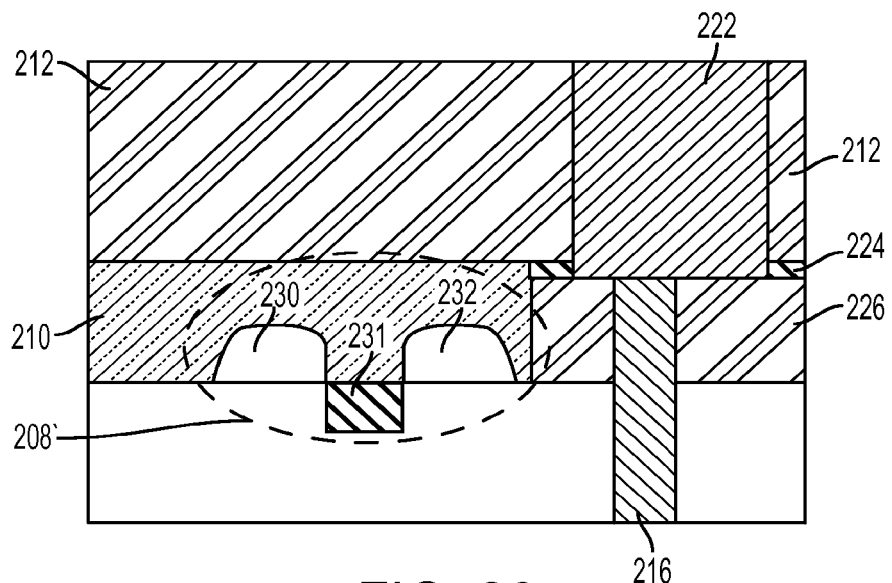
Figure 27:
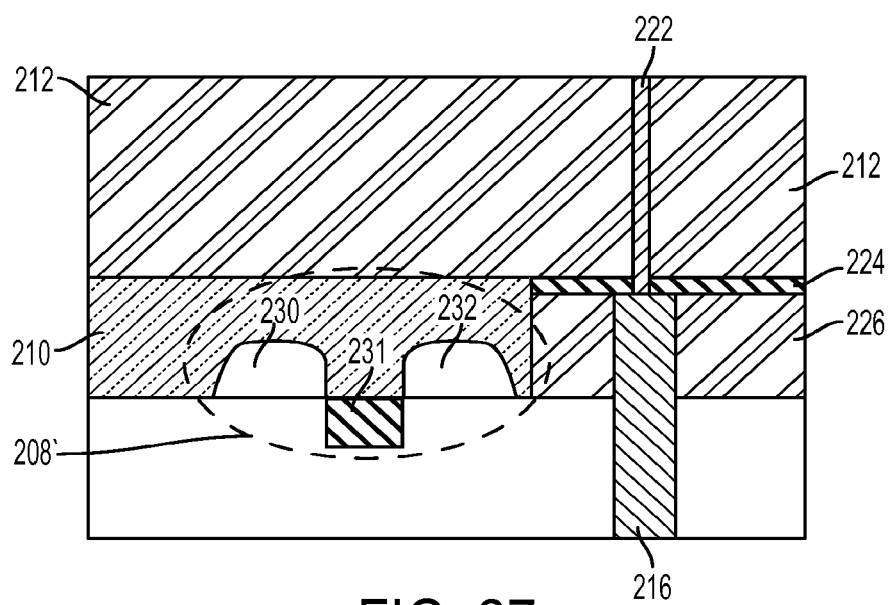

In other embodiments, the semiconductor structure may have a different number of layers of material. For example, the substrate of the semiconductor structure 2400, shown in FIG. 24, lacks additional layers 214, when compared with the substrate 206 of the semiconductor structure 1800 in FIG. 20. Nevertheless, the through wafer interconnects 216 and 222 may be formed in an at least substantially similar fashion. The semiconductor structure 2400 may be formed without additional layers 214, or additional layers 214 may be entirely removed before forming the at least one second through wafer interconnect 222. One advantage of not having additional layers 214 is that the etching process may be performed through a single homogeneous material, rather than through two or more different layers. Etchants may have different etch rates through different materials. Thus, etching through a homogeneous material may be more consistent than etching through different materials. As described with reference to FIG. 21, the second through wafer interconnect 222 may extend laterally beyond a laterally periphery of the shallow trench isolation structure 226, as shown in FIG. 25. In other embodiments, the second through wafer interconnect 222 may not extend laterally beyond a lateral periphery of the shallow trench isolation structure 226, but may be wider than the first through wafer interconnect 216, as shown in FIG. 26. The second through wafer interconnect 222 may also have a smaller cross-sectional area than the first through wafer interconnect 216, as shown in FIG. 27.

Figure 28:
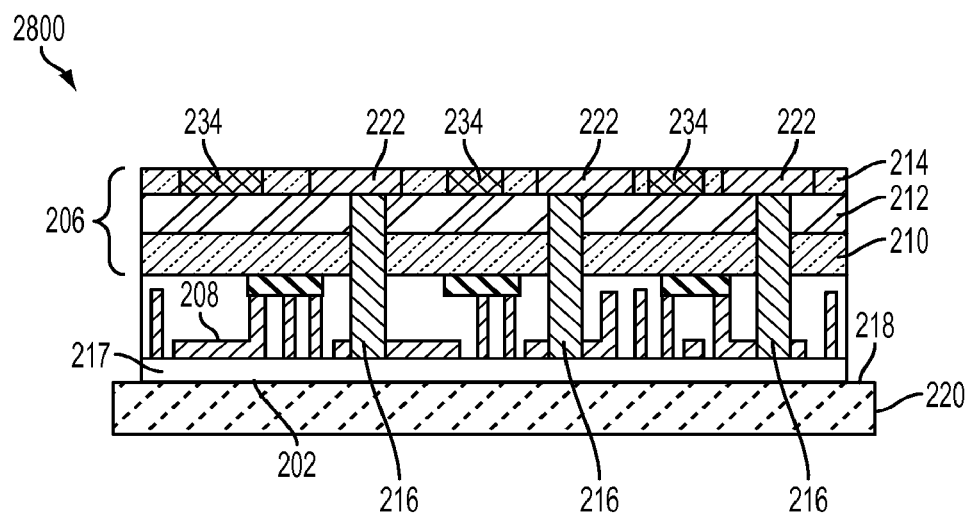
Figure 29:
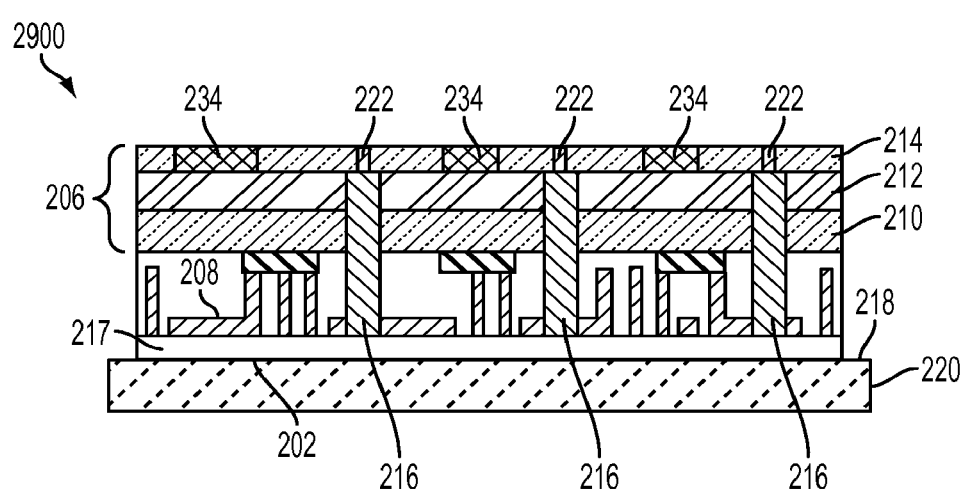

Some embodiments of the invention may also have at least one heat management structure 234 formed in the substrate 206. FIGS. 28 and 29 show semiconductor structures 2800 and 2900 having heat management structures 234 formed only in the substrate 206. The heat management structures may be formed in a manner similar to the formation of through wafer interconnects, as previously discussed herein. For example, a patterned mask layer (not shown) may be applied to the substrate 206 to protect areas not to be etched. The structure exposed through the patterned mask layer then may be subjected to an etchant. The resulting hole may be filled with a material to form the heat management structure 234. The material forming the heat management structure need not be electrically conductive, though it may be. The material may be selected to have desirable heat transfer properties (e.g., properties that cause the overall semiconductor structure to have a desirable coefficient of thermal expansion).

Figure 30:
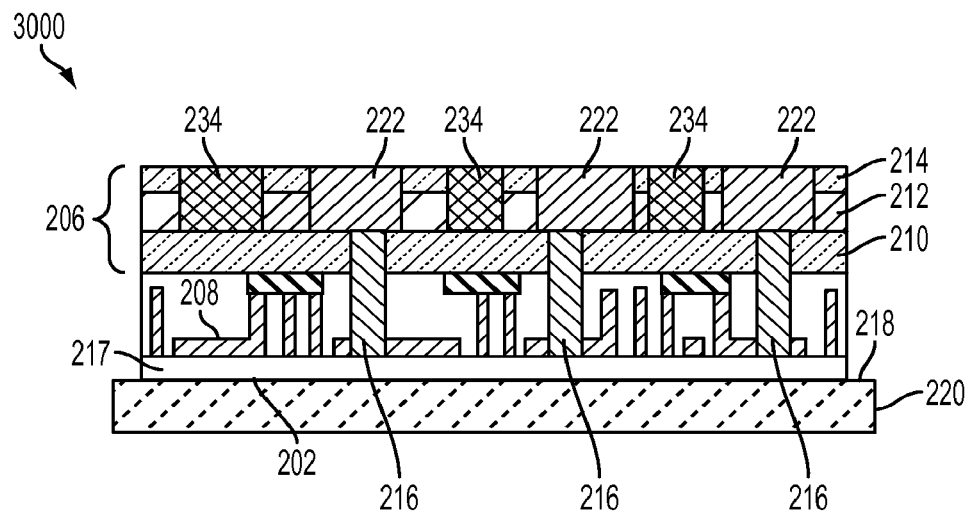
Figure 31:
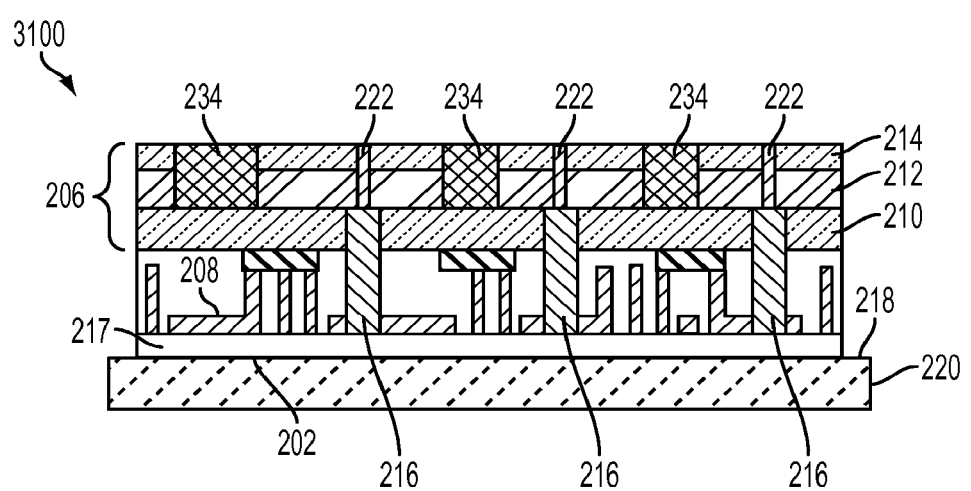

The heat management structures 234 may also be formed across two or more layers, such as across the substrate 206 and the insulator 212, as shown in the semiconductor structures 3000 and 3100 of FIGS. 30 and 31. Whatever the placement, the heat management structures 234 may comprise at least one dummy metal pad, electrically isolated from the device structures 208. Electrical isolation may be due to a physical barrier between the heat management structures 234 and the device structures 208 or may be a result of low electrical conductivity of the material of the heat management structures 234.

The heat management structures 234 can improve the thermal management of the system by balancing the vertical thermal resistance with lateral heat spreading. By varying the size, number, composition, placement, shape, or depth of the heat management structures 234, the coefficient of thermal expansion may be tailored to a desired value. This desired coefficient of thermal expansion may be selected to match the coefficient of thermal expansion of another semiconductor structure to which the semiconductor structures 2800, 2900, 3000, and 3100 may later be bonded. The heat management structures 234 may be formed of one or more metals such as copper, tungsten, aluminum, tin, silver or an alloy based on one or more such metals, or any other material that is relatively more thermally conductive than the substrate 206. Changes in the heat management structures 234 may be used instead of or in conjunction with changes in the size, number, composition, placement, shape, or depth of the first through wafer interconnect 216 and of the second through wafer interconnect 222 to achieve a desired coefficient of thermal expansion.

In some embodiments, one or more conductive interconnect layers 236 may be formed over the substrate 206 to change the location of electrical contacts. For example, in FIGS. 32 and 33, semiconductor structures 3200 and 3300 each have multiple conductive interconnect layers 236 atop the substrate 206 of semiconductor structures 1500 and 1400, respectively. One conductive interconnect layer 236 may have conductive material in contact with the second through wafer interconnect 222. Each conductive interconnect layer 236 may have conductive material in contact with another conductive interconnect layer 236. The conductive interconnect layers 236 may collectively provide electrical connections between various points on the surface of the semiconductor structure 200 to the device structures 208.

Conductive interconnect layers 236 may be formed by any method known in the art. For example, one or more additional dielectric layers may be deposited on substrate 206. A patterned mask layer may be applied to the additional dielectric layers to protect areas not to be etched. The additional dielectric layers then may be subjected to a selective etchant through the patterned mask layer, using a wet chemical etching process, a dry reactive ion etching process, or any other etching process known in the art. The holes or voids (commonly referred to as vias) formed may then be filled with one or more electrically conductive materials to form the conductive interconnect layers 236.

The conductive metal interconnect layers 236 may be used to reroute electrical contacts to match the contacts on other semiconductor structures. Using conductive interconnect layers may avoid the requirement to use a separate interposer. Avoiding use of a separate interposer may reduce production and maintenance costs by limiting the number of different parts required and by limiting the problems of thermal mismatch. The conductive interconnect layers 236 may have coefficients of thermal expansion tailored to match the coefficients of thermal expansion of semiconductor structures 1500 and 1400 or of other semiconductor structures to which semiconductor structures 3200 and 3300 may be attached.

Figure 32:
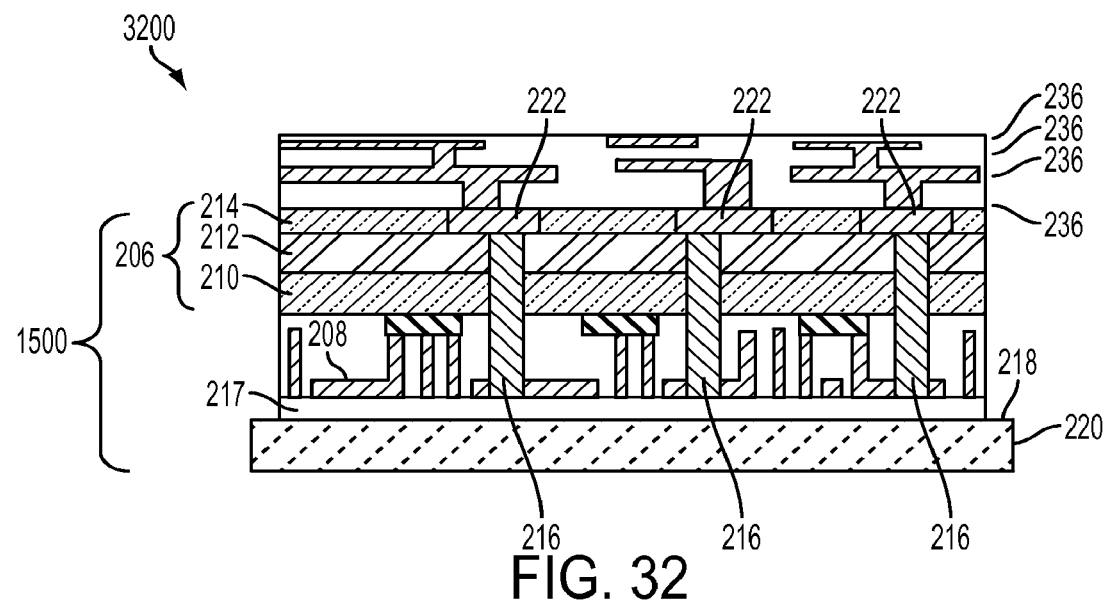
Figure 33:
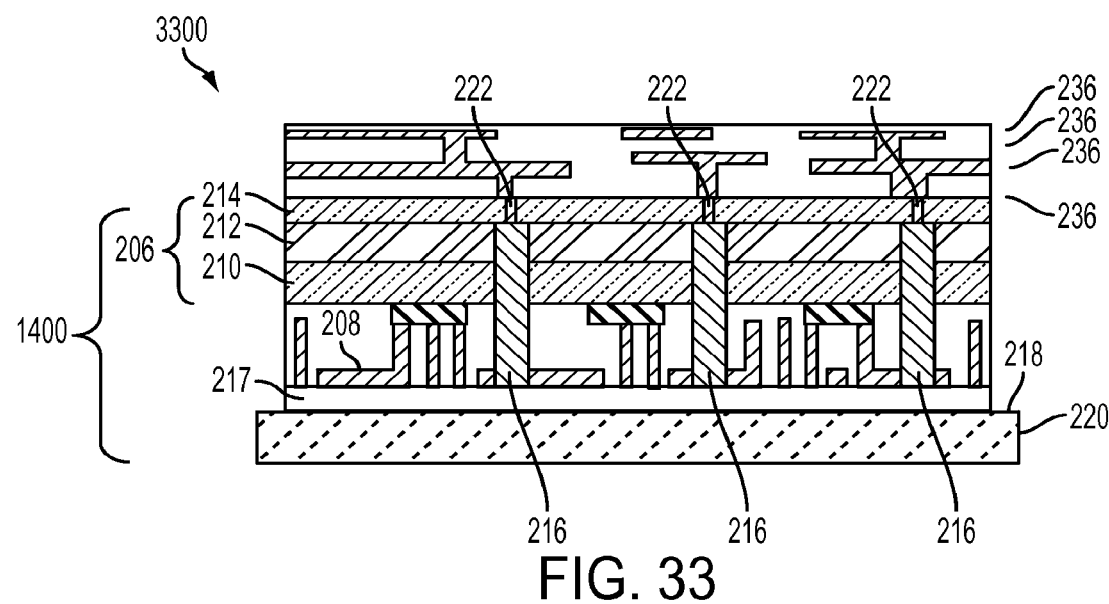
Figure 34:
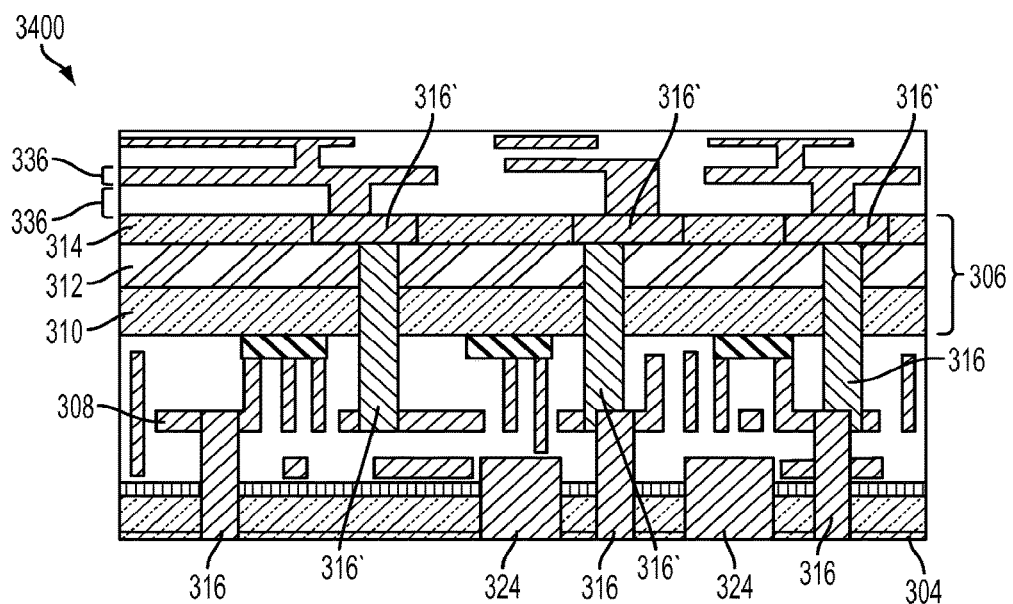
FIGS. 34 and 35 are simplified, schematic cross-sectional views of semiconductor structures and illustrate example embodiments of the invention for forming bonded semiconductor structures, combining methods of previous figures.

Multiple methods described above may be combined into a single semiconductor structure. For example, FIG. 34 shows a semiconductor structure 3400 with through wafer interconnects 316 formed through the active surface, as shown in FIG. 8, combined with through wafer interconnects 316' formed in stages through both the active and back surfaces, as shown in FIG. 32. Any of the through wafer interconnects 316 may connect to device structures 308, may take the place of separate interposers, and may contribute to a desired coefficient of thermal expansion of the semiconductor structure 3400.

As described with reference to previous embodiments, the semiconductor structure 3400 may have a back surface 304, and may include at least one device structure 308 formed in and/or over a substrate 306. At least one through wafer interconnect 316 may be formed through the back surface 304, connecting with the device structure 308. The semiconductor structure 3400 may comprise a semiconductor 310 and an insulator 312. Further, through wafer interconnects 316 may be formed through the semiconductor 310 and insulator 312. One or more conductive interconnect layers 336 may be formed on the substrate 306, and may connect to through wafer interconnects 316. There may be at least one heat management structure 324 formed within the semiconductor structure 3400 to help achieve a desired coefficient of thermal expansion.

Figure 35:
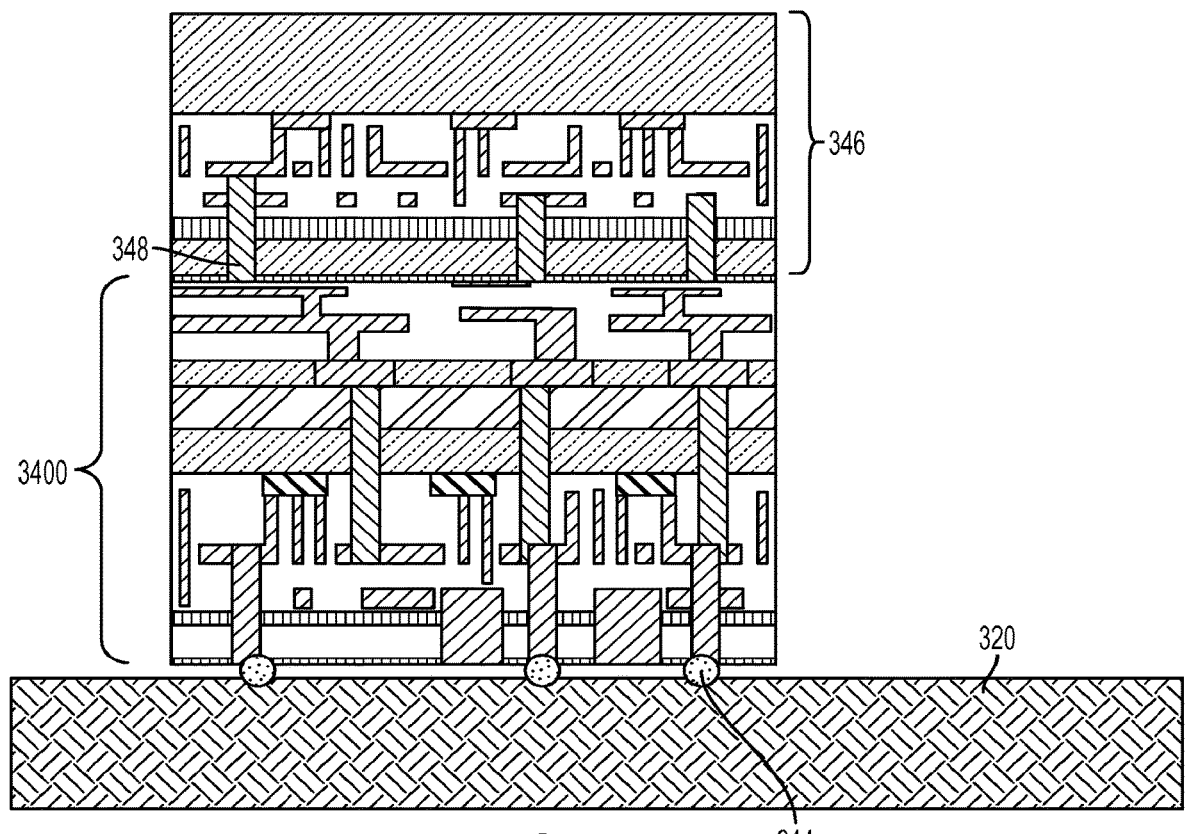

In a further embodiment shown in FIG. 35, the semiconductor structure 3400 may be placed in electrical contact with another substrate 320, such as a circuit board. The semiconductor structure 3400 may have conductive bumps 344 connecting the semiconductor structure 3400 to the substrate 320. Conductive bumps 344 may be formed by any method known in the art, such as by deposition of one or more metals. An additional semiconductor structure 346 may placed in electrical contact with the semiconductor structure 3400 on a side opposite the substrate 320. There may be metal bonding points 348 connecting the semiconductor structure 300 to the additional semiconductor structure 346. These metal bonding points 348 may be formed by depositing and reflowing conductive bumps or balls, as previously described herein. In such methods, the bonding process may be carried out at a temperature or temperatures of about 400° C. or less, or even about 350° C. or less, to avoid causing thermal damage to device structures. In additional embodiments, the metal bonding points may be formed using a direct metal-to-metal bonding process without using any intermediate adhesive or other bonding material. For example, such a direct bonding process may comprise any of a thermo-compression direct bonding process, an ultra-low temperature direct bonding process, and a surface-assisted direct bonding process, as such processes have been previously defined herein.

In some embodiments, semiconductor structures may be formed with thicker layers than is required in the final product. This may be done to avoid the problems associated with handling very thin wafers. The semiconductor structures may be thinned later, after forming through wafer interconnects and other features. For example, embodiments of the invention may utilize semiconductor structure 1100 (of FIG. 11). The thickness of semiconductor structure 1100 and particularly substrate 206 may be formed with thicker layers than is required in the final product. For example, the insulator layer 212 may have a thickness of at least approximately 100 μm, at least approximately 300 μm, or even at least approximately 500 μm By increasing layer thickness of insulator 212, problems of handling very thin semiconductor structures may be avoided, and better control of aspect ratio etching may be possible.

Figure 36:
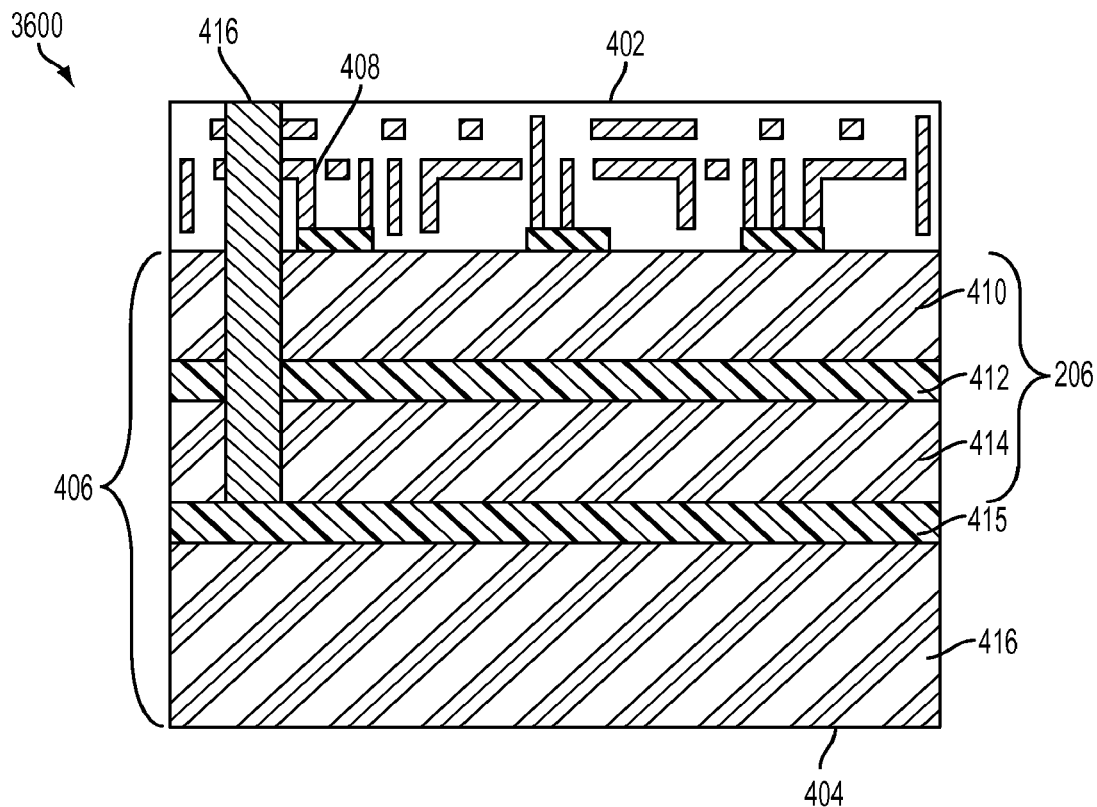
FIGS. 36 through 39 are simplified, schematic cross-sectional views of semiconductor structures and illustrate further example embodiments of the invention for forming bonded semiconductor structures.
Figure 37:
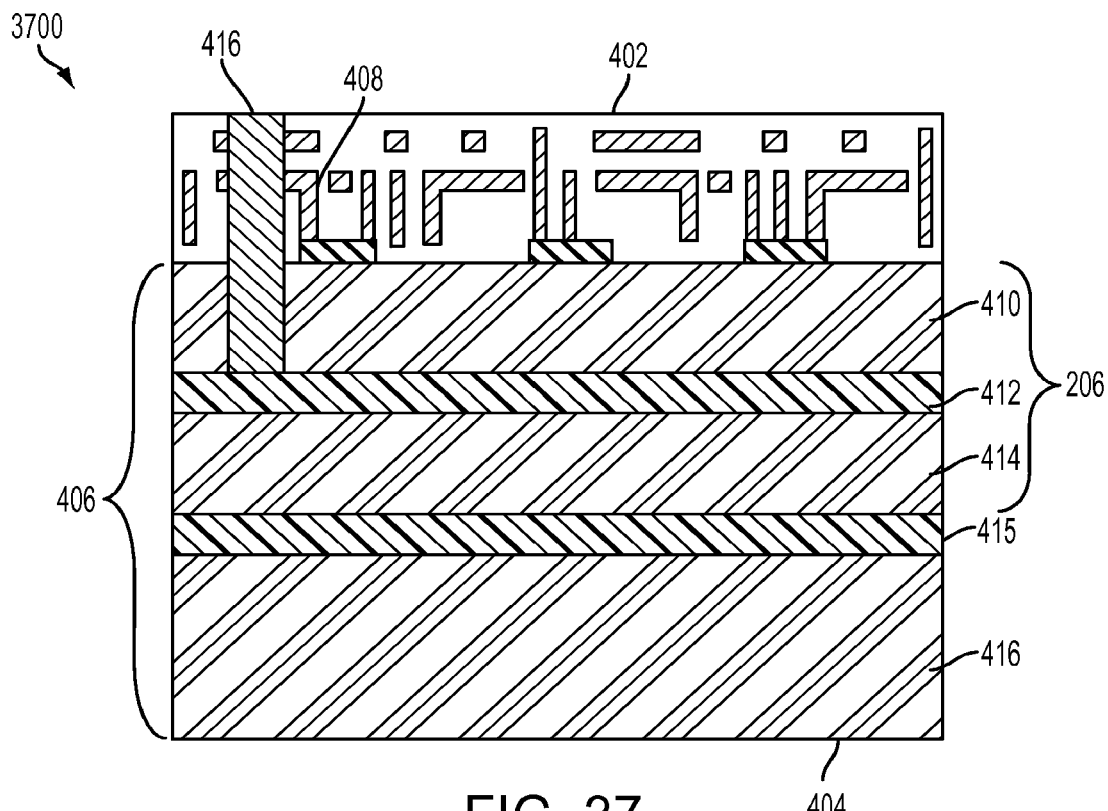

The present invention also includes forming a semiconductor structure 3600, as shown in FIG. 36, having an active surface 402 on a first side of the semiconductor structure 3600, and a back surface 404 on a second, opposite side of the semiconductor structure 3600 and comprising at least one device structure 408 on and/or over a substrate 406. The substrate 406 may comprise a structure similar to that of substrate 206 (of FIG. 11), i.e., comprising semiconductor 410, an insulator 412 and one or more additional layers 414, such as an additional layer of semiconductor material. In some embodiments, substrate 406 may also comprise one or more additional insulators layer 415 and one or more additional semiconductor layers 416. The layers 410, 414 and 416 may comprise one or more semiconductor materials such as silicon (Si), germanium (Ge), a III-V semiconductor material, etc. Furthermore, the substrate 406 may comprise a single crystal of semiconductor material, or an epitaxial layer of semiconductor material. The insulator layers 412 and 415 may comprise one or more layers of dielectric materials such as oxide (for example, silicon dioxide ($SiO_2$) or aluminum oxide ($Al_2O_3$)), a nitride (for example, silicon nitride ($Si_3N_4$) or boron nitride (BN)), etc As described previously with reference to FIG. 5, at least one through wafer interconnect 416 may be formed through the semiconductor structure 3600 from the active surface 402 through the semiconductor layer 410, the insulating layer 412 and the one or more additional 414 substrate 406 by etching as described above or by any other method known in the art. The through wafer interconnect 416 may connect to the device structure 408. By adding layers of semiconductor and insulator, problems of handling very thin semiconductor structures may be avoided, and better control of aspect ratio etching may be possible. For example, the one or more semiconductor layers may be etched preferentially over the one or more insulator layers by selection of etch process and chemistry. In other words the one or more insulator layers may be utilized as etch stops to aid in the formation of the through wafer interconnect 416.

Figure 38:
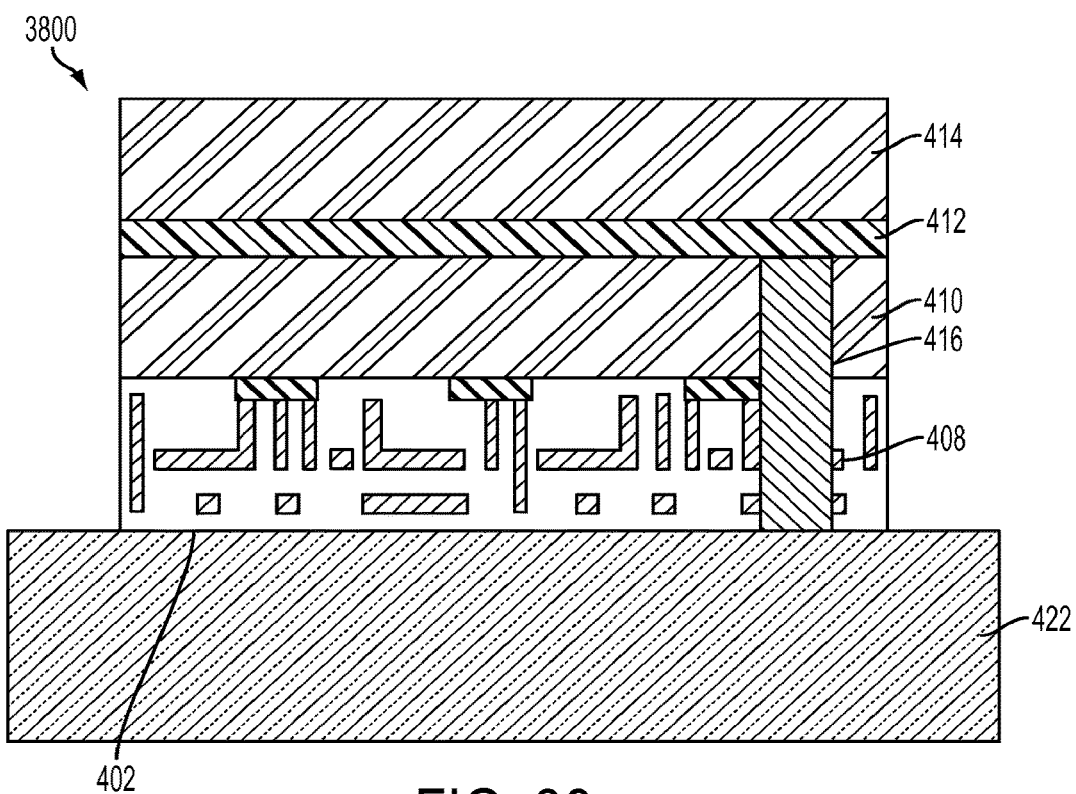
Figure 39:
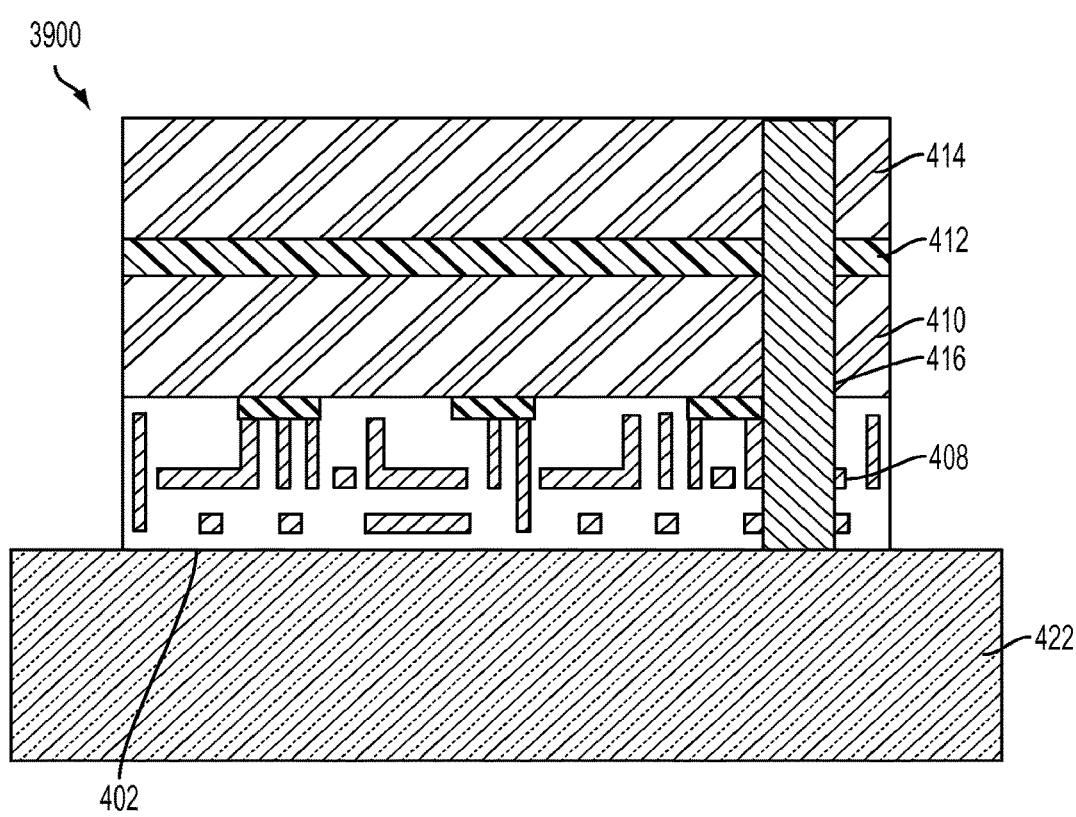

The through wafer interconnect 416 may be formed through multiple semiconductor layers 410 and 414, and through insulator layers 412, as shown in FIG. 36. In another embodiment, the through wafer interconnect 416 may be formed through a single semiconductor layer 410, stopping at an insulator 412, as shown in semiconductor structure 3700 in FIG. 37. The active surface 402 of the semiconductor structure 3700 may be bonded to a carrier substrate 422, as illustrated in FIG. 38. The semiconductor structure 3700 may be thinned by removing material therefrom, using a chemical mechanical polishing process or any other method known in the art. In certain embodiments, an entire semiconductor layer 416 and an entire insulator 415 may be removed, as shown by semiconductor structure 3800 in FIG. 38. Thinning the semiconductor structure 400 may leave the through wafer interconnect 416 exposed, as shown by semiconductor structure 3900 in FIG. 39. In such embodiments, other semiconductor structures (not shown) may be electrically connected to the exposed through wafer interconnect 420.

In the methods described hereinabove, each of the various manufacturing processes performed as part thereof may be carried out at a temperature or temperature of about 400° C. or less, or even about 350° C. or less, to avoid causing thermal damage to previously fabricated device structures in the semiconductor structures being processed. In other words, in the methods described hereinabove, each of the various manufacturing processes performed as part thereof may be carried out without exposing the semiconductor structures to temperatures over about 400° C., or even to temperatures over about 350° C., to avoid causing thermal damage to previously fabricated device structures in the semiconductor structures being processed.

The embodiments of the invention described above do not limit the scope of the invention. These are merely examples of embodiments of the invention, which is defined by the scope of the appended claims and their legal equivalents. Any equivalent embodiments are intended to be within the scope of this invention. Indeed, various modifications of the invention, in addition to those shown and described herein, such as alternate useful combinations of the elements described, will become apparent from the description to those skilled in the art. Such modifications are also intended to fall within the scope of the appended claims. Headings are used herein for clarity and convenience only, and do not limit the scope of the claims below.

What is claimed is:

1. A method of forming a bonded semiconductor structure, comprising:
   providing a first semiconductor structure comprising at least one device structure, the at least one device structure of the first semiconductor structure being embedded below a first surface of a substrate of the first semiconductor structure and above a second surface of the substrate of the first semiconductor structure such that i) a first portion of the substrate of the first semiconductor structure exists between the first surface and the at least one device structure of the first semiconductor structure, and ii) a second portion of the substrate of the first semiconductor structure exists between the second surface and the at least one device structure of the first semiconductor structure;
   bonding a second semiconductor structure to the first semiconductor structure at a temperature or temperatures below about 400° C.;
   forming a first bonding layer on the second semiconductor structure after bonding the second semiconductor structure to the first semiconductor structure;
   forming, after forming the first bonding layer, at least a first through wafer interconnect through the first bonding layer and the second semiconductor structure and into the first surface of the substrate of the first semiconductor structure to electrically connect with the at least one device structure of the first semiconductor structure;
   providing a third semiconductor structure comprising at least one device structure, the at least one device structure of the third semiconductor structure being embedded below a surface of a substrate of the third semiconductor structure;
   bonding another second semiconductor structure to the third semiconductor structure at a temperature or temperatures below about 400° C.;
   forming a second bonding layer on the another second semiconductor structure after bonding the another second semiconductor structure to the third semiconductor structure;
   forming at least a second through wafer interconnect through the second bonding layer and the another second semiconductor structure and into the surface of the substrate of the third semiconductor structure to electrically connect with the at least one device structure of the third semiconductor structure; and
   bonding i) the first bonding layer on the second semiconductor structure to the second bonding layer on the another second semiconductor structure, and ii) the first through wafer interconnect to the second through wafer interconnect.

2. The method of claim 1, wherein bonding the second semiconductor structure to the first semiconductor structure comprises:
   bonding a relatively thicker semiconductor structure to the first semiconductor structure; and
   thinning the relatively thicker semiconductor structure to form the second semiconductor structure, the second semiconductor structure comprising a relatively thinner portion of the relatively thicker semiconductor structure remaining bonded to the first semiconductor structure.

3. The method of claim 2, wherein thinning the relatively thicker semiconductor structure to form the second semiconductor structure comprises:
   implanting ions into the relatively thicker semiconductor structure along an ion implant plane; and
   fracturing the relatively thicker semiconductor structure along the ion implant plane.

4. The method of claim 3, wherein implanting ions into the relatively thicker semiconductor structure comprises implanting ions into the relatively thicker semiconductor structure prior to bonding the relatively thicker semiconductor structure to the first semiconductor structure.

5. The method of claim 3, wherein fracturing the relatively thicker semiconductor structure along the ion implant plane comprises fracturing the relatively thicker semiconductor structure along the ion implant plane after bonding the relatively thicker semiconductor structure to the first semiconductor structure.

6. The method of claim 5, wherein fracturing the relatively thicker semiconductor structure along the ion implant plane comprises heating the relatively thicker semiconductor structure to a temperature or temperatures below about 400° C. to cause the relatively thicker semiconductor structure to fracture along the ion implant plane.

7. The method of claim 1, further comprising:
forming, before bonding the first semiconductor structure to the second semiconductor structure, a third bonding layer on the first semiconductor structure,
wherein bonding the first semiconductor structure to the second semiconductor structure includes bonding the third bonding layer to the second semiconductor structure such that the second semiconductor structure is between the third bonding layer and the first bonding layer,
wherein forming the first through wafer interconnect includes forming the first through wafer interconnect through the first bonding layer, the second semiconductor structure, and the third bonding layer and into the surface of the substrate of the first semiconductor structure to electrically connect with the at least one device structure of the first semiconductor structure, and
wherein the second semiconductor structure is at least substantially comprised of silicon.

8. The method of claim 7, further comprising selecting the second semiconductor structure to be at least substantially comprised of single crystal silicon.

9. The method of claim 1, further comprising forming the at least one through wafer interconnect through the second semiconductor structure and into the first semiconductor structure to the at least one device structure at a temperature or temperatures below about 400° C.

10. The method of claim 1, further comprising forming at least one conductive structure through the first bonding layer and the second semiconductor structure to the surface of the substrate of the first semiconductor structure.

11. The method of claim 10, wherein forming the at least one conductive structure comprises forming at least one dummy metal pad, electrically isolated from the at least one device structure in the first semiconductor structure.

12. The method of claim 10, further comprising tailoring a coefficient of thermal expansion of the second semiconductor structure by varying at least one of a size, a number, a composition, a location, and a shape of the at least one conductive structure.

13. The method of claim 12, further comprising tailoring the coefficient of thermal expansion of the second semiconductor structure such that a ratio of the coefficient of thermal expansion of the second semiconductor structure to a coefficient of thermal expansion of the first semiconductor structure is between 0.67 and 1.5.

14. The method of claim 13, further comprising tailoring the coefficient of thermal expansion of the second semiconductor structure such that the ratio is between 0.9 and 1.1.

15. The method of claim 14, further comprising tailoring the coefficient of thermal expansion of the second semiconductor structure to be at least substantially equal to a coefficient of thermal expansion of the first semiconductor structure.

16. The method of claim 1, wherein bonding occurs at a temperature or temperatures below about 400° C.

17. The method of claim 1, further comprising forming additional device structures on the second semiconductor structure after bonding the second semiconductor structure to the first semiconductor structure and prior to bonding the second semiconductor structure to the third semiconductor structure.

18. A method of forming a bonded semiconductor structure, comprising:
providing a first semiconductor structure comprising at least one device structure, the at least one device structure of the first semiconductor structure being embedded below a first surface of a substrate of the first semiconductor structure and above a second surface of the substrate of the first semiconductor structure such that i) a first portion of the substrate of the first semiconductor structure exists between the first surface and the at least one device structure of the first semiconductor structure, and ii) a second portion of the substrate of the first semiconductor structure exists between the second surface and the at least one device structure of the first semiconductor structure;
bonding a second semiconductor structure to the first semiconductor structure;
implanting ions into the second semiconductor structure and forming an ion implant plane within the second semiconductor structure after bonding the second semiconductor structure to the first semiconductor structure;
forming a first bonding layer on the second semiconductor structure after implanting ions into the second semiconductor structure;
fracturing the second semiconductor structure along the ion implant plane, a portion of the second semiconductor structure remaining bonded to the first semiconductor structure;
forming, after fracturing the second semiconductor structure, at least a first through wafer interconnect through the first bonding layer and the second semiconductor structure remaining bonded to the first semiconductor structure and into the first surface of the substrate of the first semiconductor structure to electrically connect with the at least one device structure of the first semiconductor structure;
providing a third semiconductor structure comprising at least one device structure, the at least one device structure of the third semiconductor structure being embedded below a surface of a substrate of the third semiconductor structure;
bonding another second semiconductor structure to the third semiconductor structure at a temperature or temperatures below about 400° C.;
forming a second bonding layer on the another second semiconductor structure after bonding the another second semiconductor structure to the third semiconductor structure;
forming at least a second through wafer interconnect through the second bonding layer and the another second semiconductor structure and into the surface of the substrate of the third semiconductor structure to electrically connect with the at least one device structure of the third semiconductor structure; and
bonding i) the first bonding layer on the second semiconductor structure to the second bonding layer on the another second semiconductor structure, and ii) the first through wafer interconnect to the second through wafer interconnect.

19. The method of claim 18, wherein bonding the first bonding layer to the second bonding layer occurs at a temperature or temperatures below about 400° C.

20. The method of claim 18, wherein fracturing the second semiconductor structure along the ion implant plane comprises heating the second semiconductor structure to a temperature or temperatures below about 400° C. to cause the second semiconductor structure to fracture along the ion implant plane.

* * * * *